(12) United States Patent
Osako et al.

(10) Patent No.: US 7,615,855 B2
(45) Date of Patent: Nov. 10, 2009

(54) IC CARD AND METHOD OF MANUFACTURING THE SAME

(75) Inventors: Junichiro Osako, Kodaira (JP); Hirotaka Nishizawa, Fuchu (JP); Kenji Osawa, Hachioji (JP); Akira Higuchi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/116,190

(22) Filed: May 6, 2008

(65) Prior Publication Data

US 2008/0211074 A1     Sep. 4, 2008

Related U.S. Application Data

(63) Continuation of application No. 11/423,755, filed on Jun. 13, 2006, now Pat. No. 7,382,045, which is a continuation of application No. 11/264,010, filed on Nov. 2, 2005, which is a continuation of application No. 10/668,229, filed on Sep. 24, 2003, now Pat. No. 6,988,668.

(30) Foreign Application Priority Data

Oct. 8, 2002   (JP) ............................. 2002-294721

(51) Int. Cl.
*H01L 23/02* (2006.01)
*H01L 23/12* (2006.01)
*H01L 23/28* (2006.01)

(52) U.S. Cl. ..................... 257/679; 257/723; 257/787

(58) Field of Classification Search ......... 257/678–689, 257/787–794, E23
See application file for complete search history.

(56) References Cited

U.S. PATENT DOCUMENTS

| | | | |
|---|---|---|---|
| 5,866,950 A | 2/1999 | Iwasaki et al. | 257/782 |
| 6,031,724 A | 2/2000 | Takahashi | 361/737 |
| 6,076,737 A | 6/2000 | Gogami et al. | 235/492 |
| 6,433,285 B2 | 8/2002 | Maeda et al. | 174/260 |
| 6,591,494 B2 | 7/2003 | Okamura et al. | 29/832 |
| 6,780,668 B1 | 8/2004 | Tsukahara et al. | 438/106 |
| 6,988,668 B2 * | 1/2006 | Osako et al. | 235/492 |
| 7,427,032 B2 * | 9/2008 | Osako et al. | 235/492 |
| 2001/0009505 A1 | 7/2001 | Nishizawa et al. | 361/737 |
| 2002/0027274 A1 | 3/2002 | Usami et al. | 257/679 |
| 2006/0157838 A1 | 7/2006 | Bolken | 257/678 |
| 2006/0202041 A1 * | 9/2006 | Hishizawa et al. | 235/492 |
| 2007/0045873 A1 | 3/2007 | Takemoto | 257/784 |

FOREIGN PATENT DOCUMENTS

| | | |
|---|---|---|
| JP | 2001-325578 | 11/2001 |
| JP | 2002-176066 | 6/2002 |

* cited by examiner

*Primary Examiner*—Cuong Q Nguyen
(74) *Attorney, Agent, or Firm*—Miles & Stockbridge P.C.

(57) ABSTRACT

An IC body is loaded to a case 2 made of thermosetting resin material and sealed with a sealing portion made of thermosetting resin material to be integrated, whereby an IC card is manufactured. The IC body comprises: a wiring substrate formed with an external connection terminal at a back surface thereof; a semiconductor chip loaded over a surface of the wiring substrate and electrically connected to the external connection terminal via a interconnect; and the sealing portion made of thermosetting resin material so as to cover the semiconductor chip and a bonding wire. The sealing portion is formed so that the external connection terminal is exposed. The present invention makes it possible to heighten the strength of IC cards and at the same time, to reduce the manufacturing cost and improve the reliability.

12 Claims, 26 Drawing Sheets

1: IC CARD
2: CASE
3: SEALING PORTION
4: IC BODY
5: WIRING SUBSTRATE
6: EXTERNAL CONNECTION TERMINAL
7: SEMICONDUCTOR CHIP
8: SEALING PORTION
9: BONDING WIRE

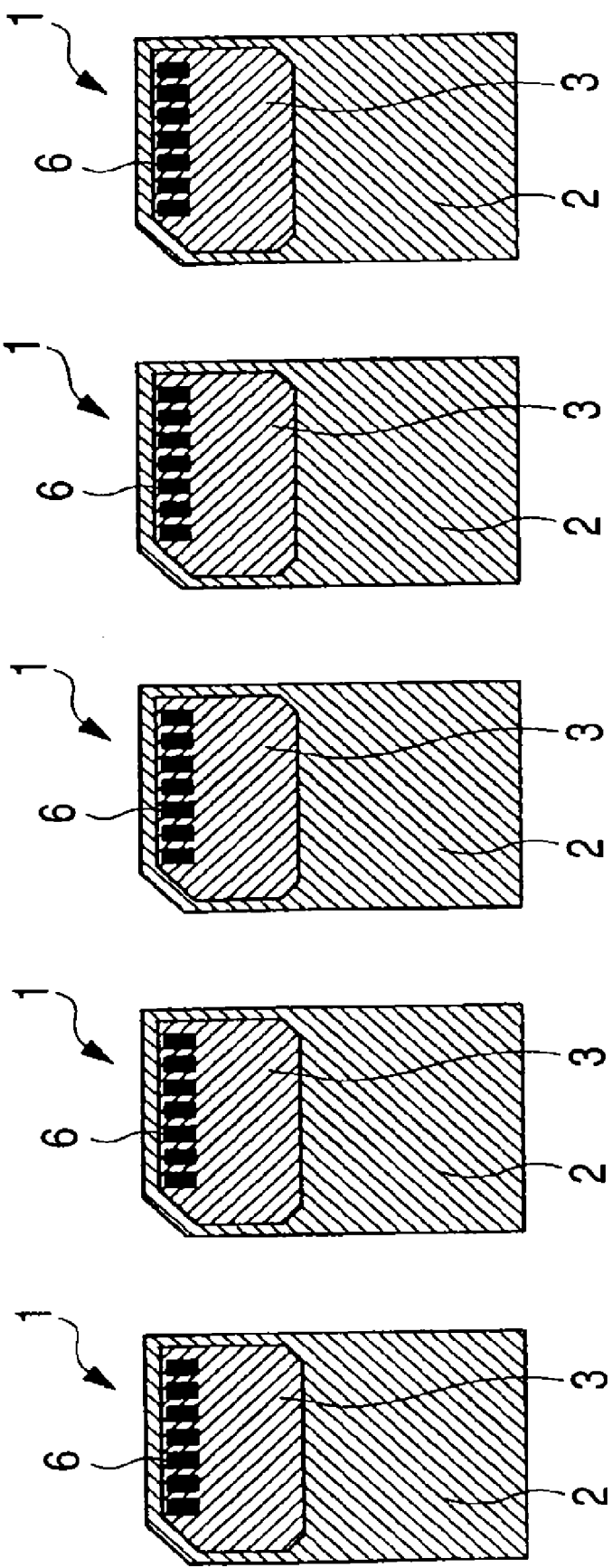

IC CARD AND METHOD OF MANUFACTURING THE SAME

CROSS-REFERENCE TO RELATED APPLICATION

This application is a continuation of application Ser. No. 11/423,755 filed Jun. 13, 2006 now U.S. Pat. No. 7,382,045, which is a continuation of application Ser. No. 11/264,010 filed Nov. 2, 2005, which is a continuation of application Ser. No. 10/668,229 filed Sep. 24, 2003(now U.S. Pat. No. 6,988,668 issued Jan. 24, 2006).

BACKGROUND OF THE INVENTION

The present invention relates to IC (integrated circuit) cards and manufacturing techniques thereof, for example, a technique effective when adapted to a semiconductor memory card (which will hereinafter be called "memory card").

A variety of IC cards have been used and semiconductor memory cards (which will hereinafter be called "memory cards", simply) such as multimedia cards (having standards standardized by Multimedia Card Association) and SD memory cards (having standards standardized by SD Card Association) can be classified as memory devices capable of storing information in semiconductor memory chips inside thereof. When they are used, information is available by accessing directly and electrically to a non-volatile memory of the semiconductor memory chip, and a memory medium can be change easily without controlling the machine system. Thus, they have excellent features. Owing to compact size and light weight, they are used as an auxiliary storage unit for apparatuses which require portability such as mobile personal computer, mobile phone and digital camera.

In the manufacture of a small-size memory card, it is the common practice to cover a wiring substrate and a semiconductor chip with a case made of plastic. As a manufacturing method of a smaller and thinner memory card, there exists a technique of carrying out injection molding of an epoxy resin (thermosetting resin) while putting, in a mold, a circuit substrate having a semiconductor memory chip mounted thereon, thereby forming the memory card integral with its case (for example, refer to Patent Document 1 and Patent Document 2).

Patent Document 1: Japanese Patent Application Laid-Open No. 2001-325578

Patent Document 2: Japanese Patent Application Laid-Open No. 2002-176066

SUMMARY OF THE INVENTION

A memory card formed integral with its card case has the advantage that strength is high and water does not penetrate into it easily, because it has less space in it compared with a memory card inserted in a case.

IC cards are however required to be produced at a reduced cost as well as to have higher strength, and in order to satisfy this, there is a demand for reducing the cost of materials therefor and improving their mass productivity.

A thermosetting resin ordinarily employed for sealing of a semiconductor, for example, a filler-containing epoxy resin, has a silica powder filled in the resin for a reduction in thermal stress with an Si chip and improvement of the strength of the material. According to the investigation by the present inventors, use of a molding resin having such a high modulus of elasticity for the formation of the outer face of the IC card is accompanied with the problem that upon inserting or removing the IC card in or from a slot, a coating such as Au plating formed on the surface of the electrode in the slot is impaired.

When a solder connection for electrically connecting a semiconductor chip to an interconnect over a wiring substrate is exposed from the wiring substrate, it is necessary, upon molding, to select a processing temperature so that the temperature of the solder connection will not exceed the melting point of the solder, which, however, imposes a severe limitation on the kind of a usable resin.

An object of the present invention is to provide an IC card with high reliability and a manufacturing method thereof.

Another object of the present invention is to provide an IC card which can be produced at a reduced cost and a manufacturing method thereof.

The above-described and the other objects as well as novel features of the present invention will be apparent from the description herein and accompanying drawings.

Of the inventions disclosed by the present application, typical ones will next be outlined simply.

In one aspect of the present invention, there is thus provided An IC card which comprises a semiconductor device having a semiconductor chip at least partially sealed with a first sealing portion made of a thermosetting resin material and having, over a first surface of the semiconductor device, an external connection terminal electrically connected to the semiconductor chip; a case which is made of a thermoplastic resin material and over which the semiconductor device is to be loaded; and a second sealing portion which is made of a thermoplastic resin material and seals the semiconductor device so as to expose the external connection terminal, thereby integrating the semiconductor device with the case.

In another aspect of the present invention, there is also provided a manufacturing method of an IC card, which comprises the steps of: preparing a semiconductor device having a semiconductor chip at least partially sealed with a first sealing portion made of a thermosetting resin material and having, over a first surface of the semiconductor chip, an external connection terminal electrically connected to the semiconductor chip; preparing a case which is made of a thermoplastic resin material and over which the semiconductor device can be loaded; loading the semiconductor device over the case; and sealing the semiconductor device with a second sealing portion made of a thermoplastic resin material so as to expose the external connection terminal, thereby integrating the semiconductor device with the case.

BRIEF DESCRIPTION OF THE DRAWINGS

FIG. 51 is a plan view of the IC card during its manufacturing step following the step of FIG. 50.

DETAILED DESCRIPTION OF THE PREFERRED EMBODIMENTS

Figure 1:
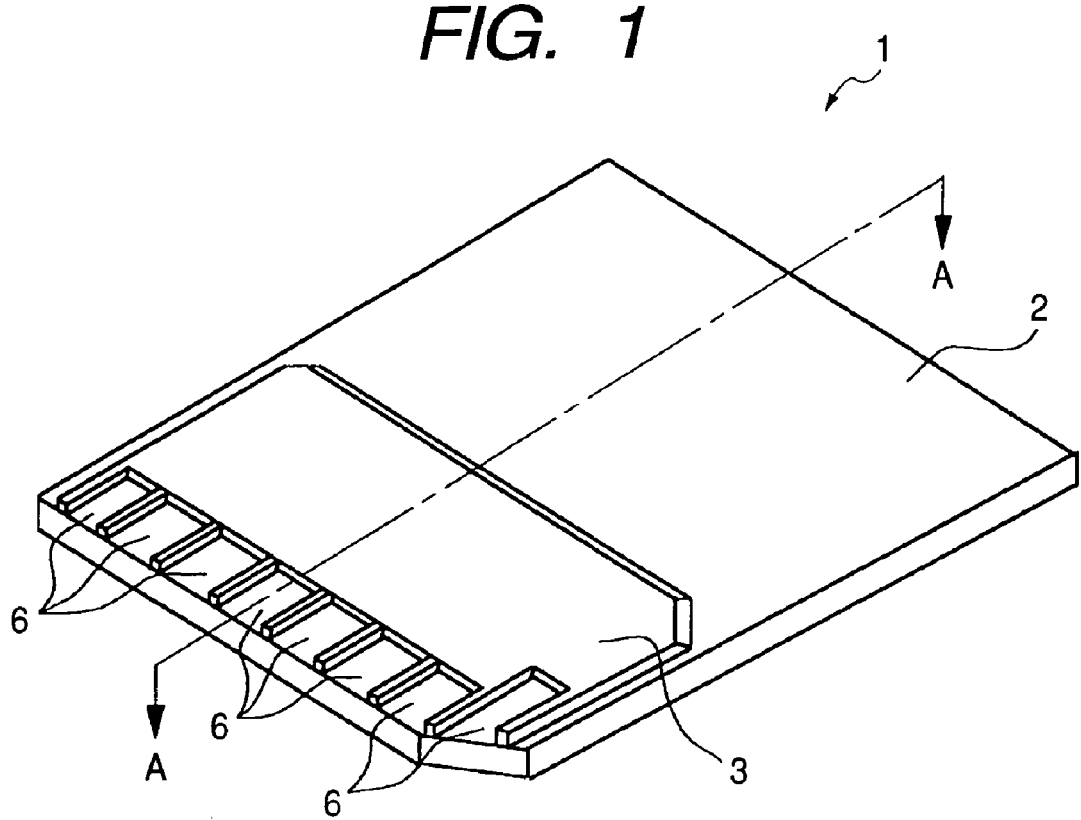
FIG. 1 is a perspective view illustrating the appearance of an IC card according to one embodiment of the present invention.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated. In the below-described embodiments, when a reference is made to the number of elements (including the number, value, amount and range), the number of elements is not limited to a specific number but can be greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential. Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range. In all the drawings for describing the below-described embodiments, elements having like function will be identified by like reference numerals and overlapping descriptions will be omitted. In the drawings used in these embodiments, even a plan view is sometimes hatched to facilitate understanding of the drawing. The embodiments of the present invention will hereinafter be described specifically based on accompanying drawings.

Embodiment 1

The IC card of this embodiment and its manufacturing steps will next be described with reference to drawings. FIG. 1 is a perspective view illustrating the appearance of an IC card according to this embodiment of the present invention, while FIG. 2 is a cross-sectional view of the IC card of FIG. 1 along a longitudinal direction (line A-A).

Figure 2:
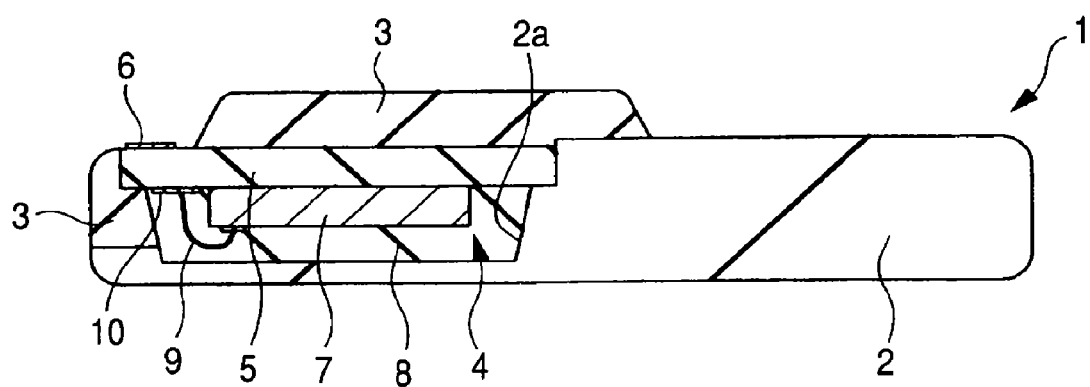
FIG. 2 is a cross-sectional view of the IC card of FIG. 1 in a longitudinal direction (line A-A)

The IC card 1 of this embodiment as illustrated in FIGS. 1 and 2 is a memory card usable mainly as an auxiliary storage unit for various portable electronic devices, for example, information processing units such as mobile computer, image processing units such as digital camera, communications devices such as mobile phone. It is usable while being installed in the electronic devices as described above. IC card 1 is, for example, a small thin plate having a rectangular plane (card shape) and it may have various outside dimensions, for example, having a long side of about 32 mm, a short side of about 24 mm and a thickness of 1.4 mm. It is a card having similar outside dimension standards and functions to those of a so-called multimedia card (which will hereinafter be abbreviated a "MMC"). The IC card 1 may be imparted with similar outside dimension standards and functions to an SD memory card (which will hereinafter be called "SD card") or another memory card.

The IC card 1 of this embodiment as illustrated in FIGS. 1 and 2 have a case 2 constituting the external shape of the IC card 1 and an IC body (semiconductor device) 4 bonded to or integrally formed with the case 2 via a sealing portion (molding resin, sealing resin) 3. The case 2 and the sealing portion 3 are each made of a thermoplastic resin material. As can be seen from the cross-sectional view of FIG. 2, the IC card is rounded at the corners thereof for preventing injuries upon handling it.

Figure 3:
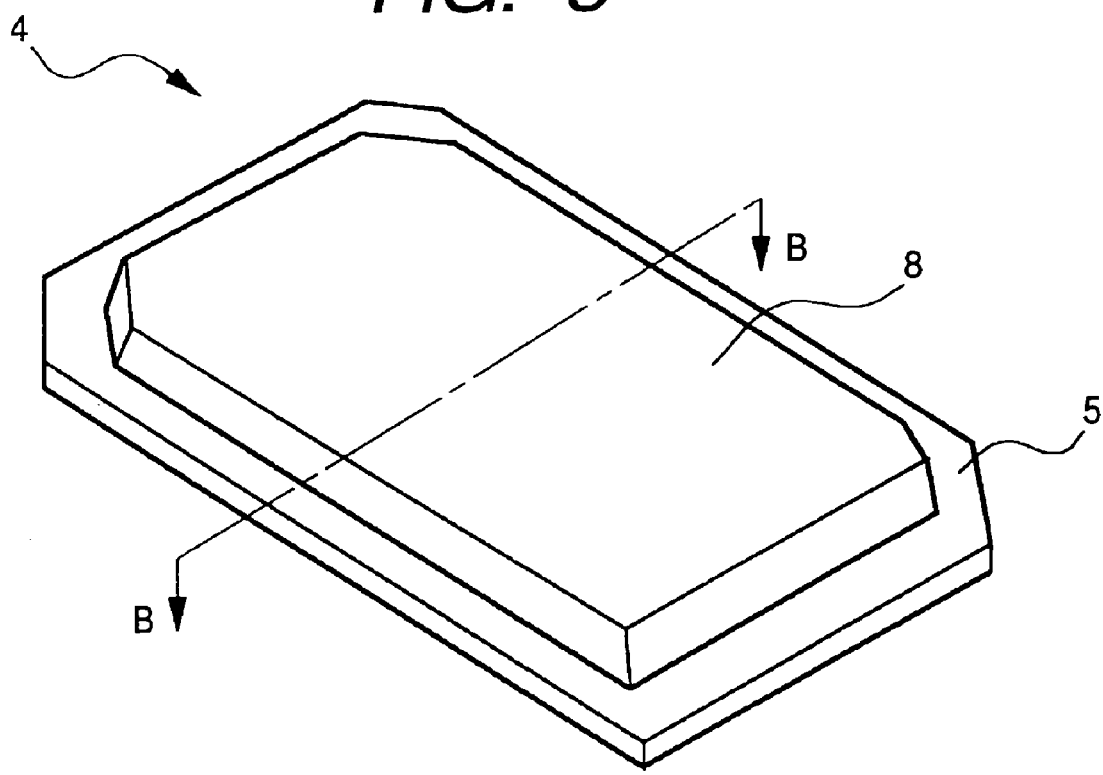
FIG. 3 is a perspective view illustrating the appearance of the IC body used for the IC card of FIG. 1.
Figure 4:
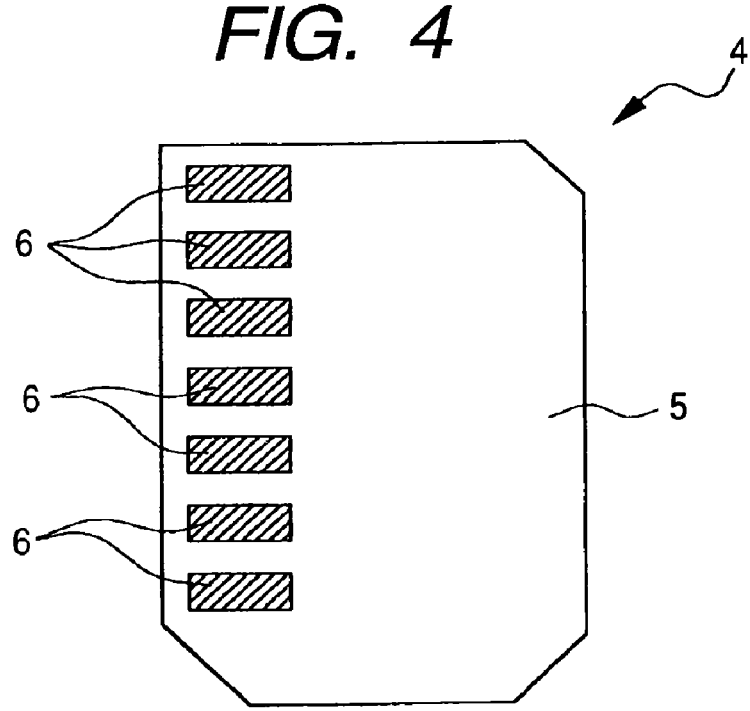
FIG. 4 is a bottom (back side) view of the IC body of FIG. 3.
Figure 5:
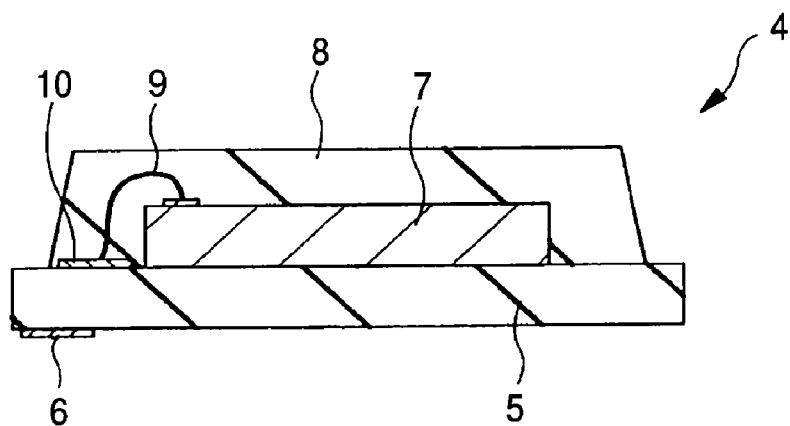
FIG. 5 is a cross-sectional view of the IC body taken along a line B-B of FIG. 3.

FIG. 3 is a perspective view illustrating the appearance of the IC body 4 used for the IC card 1 of this embodiment; FIG. 4 is a bottom (back side: first surface) of the IC body 4 of FIG. 3; and FIG. 5 is a cross-sectional view of the IC body 4 taken along a line B-B of FIG. 3.

The IC body 4 of this embodiment is a portion (semiconductor device) having a main function of the IC card 1, for example, having a function as a storage unit and has a substrate or wiring substrate 5, a plurality of external connection terminals 6 formed or disposed on the back side (first surface) of the wiring substrate 5, a semiconductor chip 7 disposed or mounted over the main surface (surface) of the wiring substrate 5, and a sealing portion (molding resin, sealing resin) 8 for sealing the semiconductor chip 7. The semiconductor chip 7 is a semiconductor chip for memory (ex. flash memory) or semiconductor chip for control and one or plural semiconductor chips 7 are mounted over the semiconductor substrate 5 as needed. An electrode or bonding pad of the semiconductor chip 7 is electrically connected to an interconnect 10 of the wiring substrate 5 via a bonding wire 9 made of a thin metal wire such as a gold (Au) wire. The sealing portion 8 is formed over the wiring substrate 5 so as to cover the semiconductor chip 7 and the connection (bonding wire 9 in this embodiment) between the semiconductor chip 7 and wiring substrate 5. Alternatively, the semiconductor chip 7 is mounted over the wiring substrate 5, for example, by forming the semiconductor chip 7 to have a bump electrode (solder bump or gold bump) and adopting a flip chip connection (flip chip bonding) technique. In the case of flip chip connection, the sealing portion 8 may be formed to fill (charge) a space between the semiconductor chip 7 and semiconductor substrate 5. Parts other than the semiconductor chip may be mounted over the wiring substrate 5. The interconnect 10 over the main surface (surface) of the wiring substrate 5 is electrically connected, via a through-hole, to the external connection terminal 6 on the back side surface of the wiring substrate 5. In other words, the semiconductor chip 7 mounted over the wiring substrate 5 is electrically connected to the external connection terminal 6 over the back side surface of the wiring substrate 5 via a bonding wire 9 and interconnect on the wiring substrate 5.

In this Embodiment, the case 2 and sealing portion 3 of the IC card 1 is made of a thermoplastic resin material, while the sealing portion 8 of the IC body 4 is made of a thermosetting resin material.

The IC body 4 is mounted (fitted) in a dent or recess portion 2a of the case 2 so that the surface of the wiring substrate 5 over which the semiconductor chip 7 is mounted comes inside and it is sealed with the sealing portion 3, whereby the IC body 4 is formed integral with the case 2 by the sealing portion 3. In other words, the back side surface (surface on the side having the external connection terminal 6) of the IC body 4 (wiring substrate 5) and at least a portion of the surface of the case 2 on the side on which the IC body 4 is mounted are covered with the sealing portion 3, whereby the case 2 is formed integral with the IC body 4 and the IC card 1 having, as an external shape, a card shape is formed. The sealing portion 3 may be formed in a region between the case 2 and the IC body 4. The sealing portion 3 is disposed in a region other than the upper part of the external connection terminal 6 so that the external connection terminal 6 is exposed. The IC card 1 has therefore an outer profile (surface) made almost of the case 2 and the sealing portion 3, that is, a thermoplastic resin material and has a structure in which the external connection terminal 6 is exposed on the end side on one surface. The sealing portion 3 and the case 2 are welded at their interface.

A description will next be made of manufacturing steps of the IC card 1 of this Embodiment. First, the IC body 4 is prepared. FIGS. 6 to 9 are cross-sectional views of the IC body 4 used for the IC card 1 of the present embodiment in its manufacturing steps.

Figure 6:
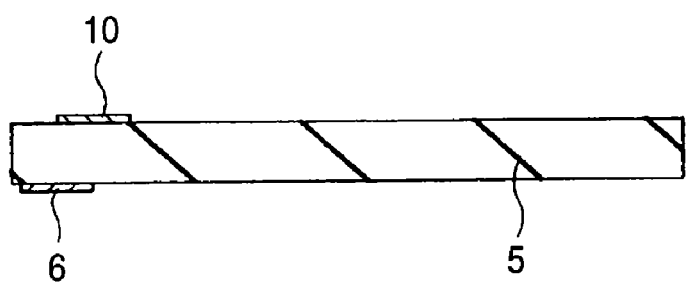
FIG. 6 is a cross-sectional view of the IC body of FIG. 3 during its manufacturing step.
Figure 7:
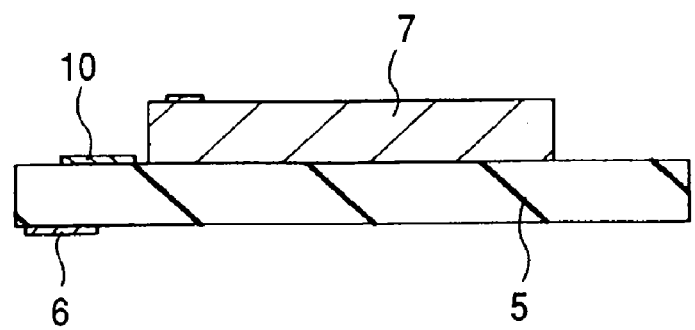
FIG. 7 is a cross-sectional view of the IC body during its manufacturing step following the step of FIG. 6.
Figure 8:
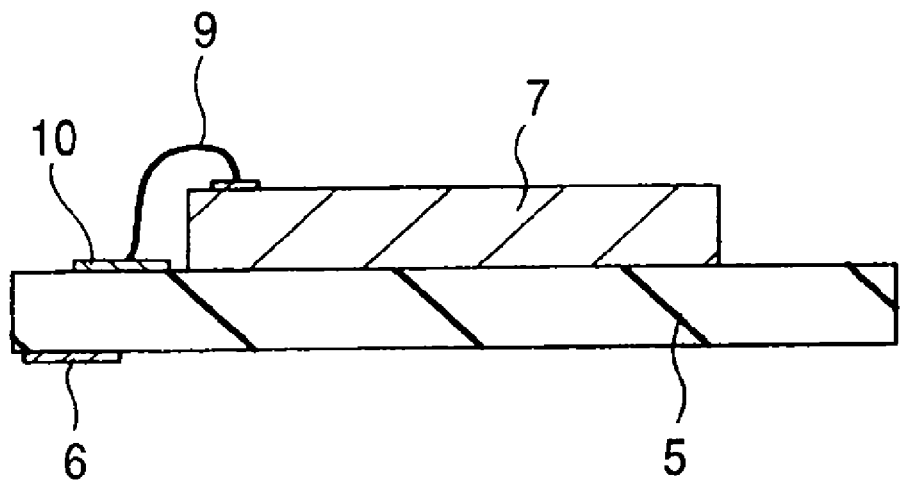
FIG. 8 is a cross-sectional view of the IC body during its manufacturing step following the step of FIG. 7.
Figure 9:
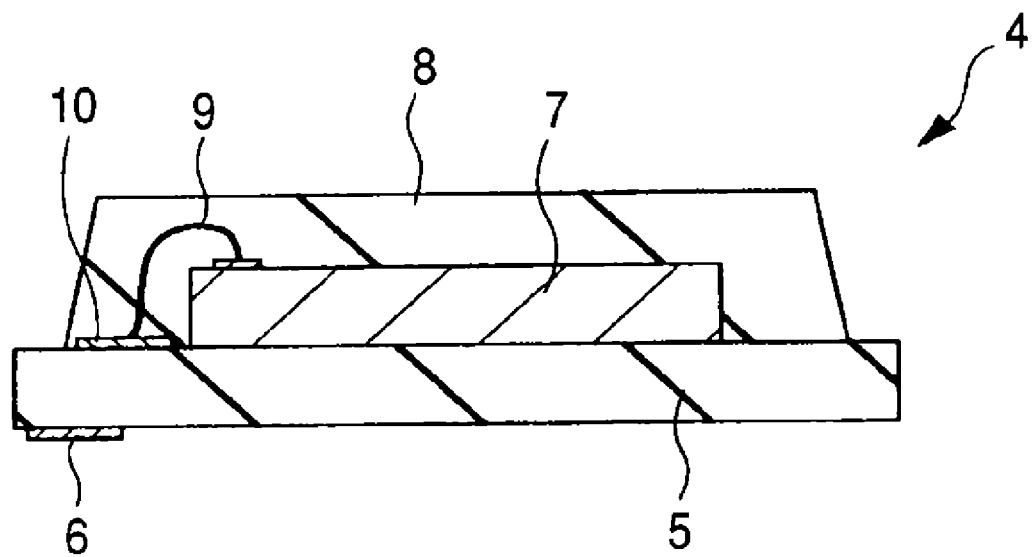
FIG. 9 is a cross-sectional view of the IC body during its manufacturing step following the step of FIG. 8.

The IC body 4 can be prepared, for example, in the following manner. As illustrated in FIG. 6, a wiring substrate 5 having an external connection terminal 6 formed over the back side surface thereof is prepared. The external connection terminal 6 of the wiring substrate 5 is electrically connected, via a through-hole, to an interconnect 10 formed over the surface (main surface) of the wiring substrate 5. As illustrated in FIG. 7, a semiconductor chip 7 (one or plural) for memory or control is disposed or mounted over the main surface (surface) of the wiring substrate 5. Upon mounting of the semiconductor chip, when the semiconductor chip is fixed using a thermosetting resin, disposal of the semiconductor chip must be followed by heat treatment for thermosetting the resin. As illustrated in FIG. 8, wire bonding is conducted to electrically connect the bonding pad of the semiconductor chip 7 to the interconnect 10 over the main surface of the wiring substrate 5 via a bonding wire 9. Then, as illustrated in FIG. 9, the semiconductor chip 7 is sealed with a sealing portion 8. In this step, the sealing portion 8 made of a thermosetting resin material is formed over the wiring substrate 5 by transfer mold or the like method so as to cover the semiconductor chip 7 and bonding wire 9 with the material. The sealing portion 8 is made of, for example, an epoxy resin and it may contain a silica filler. In the above-described manner, the IC body 4 can be formed or manufactured.

When, as a material of the semiconductor chip 7, a material having a thermal expansion coefficient smaller than that of the wiring substrate 5 or sealing portion 3 (molding resin) is used, it is effective to cover, in advance, the main surface of the semiconductor chip 7 with a sealing portion 8 made of a resin having a thermal expansion coefficient falling within a range between those of the semiconductor chip 7 and sealing portion 3 in order to reduce a thermal stress which will otherwise occur owing to a mismatch of the thermal expansion coefficient between the semiconductor chip 7 and the other member. In this embodiment, when the semiconductor chip 7 formed using an Si semiconductor substrate is adopted, the reliability of the IC card 1 can be improved further by forming the sealing portion 8 from an epoxy resin, which has a silica filler contained therein to adjust the thermal expansion coefficient, to cover the semiconductor chip 7.

In addition, the reliability of the IC card 1 can be improved more by covering the main surface of the semiconductor chip 7 in advance with the sealing portion 8 made of a resin having an alkali ion concentration smaller than that of the sealing portion 3 (molding resin), in order to prevent contamination of the semiconductor chip 7 by an alkali ion contained in an organic resin and a deterioration in electric properties due to the contamination.

Figure 10:
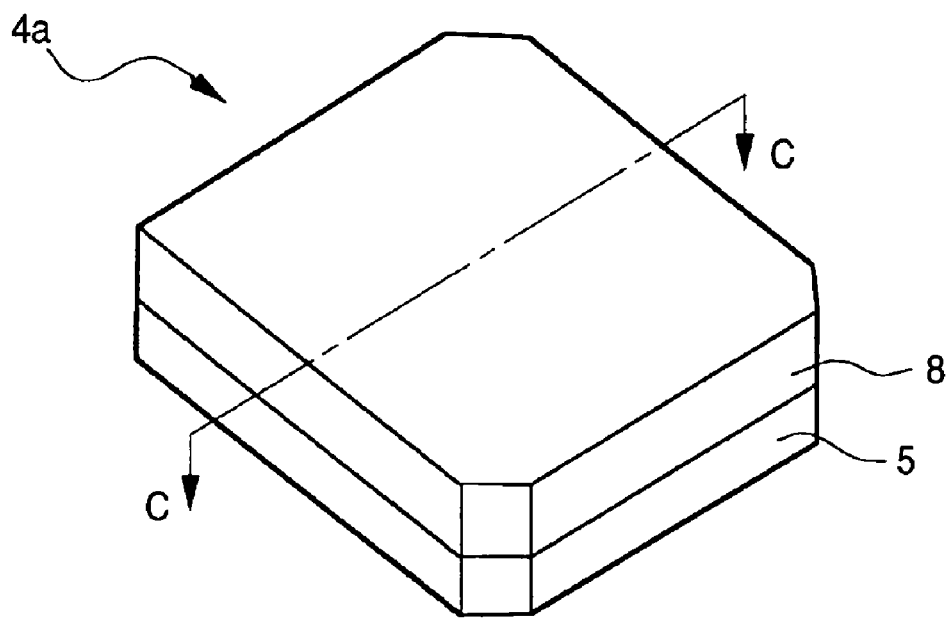
FIG. 10 is a perspective view illustrating the appearance of another IC body used for the IC card of FIG. 1.
Figure 11:
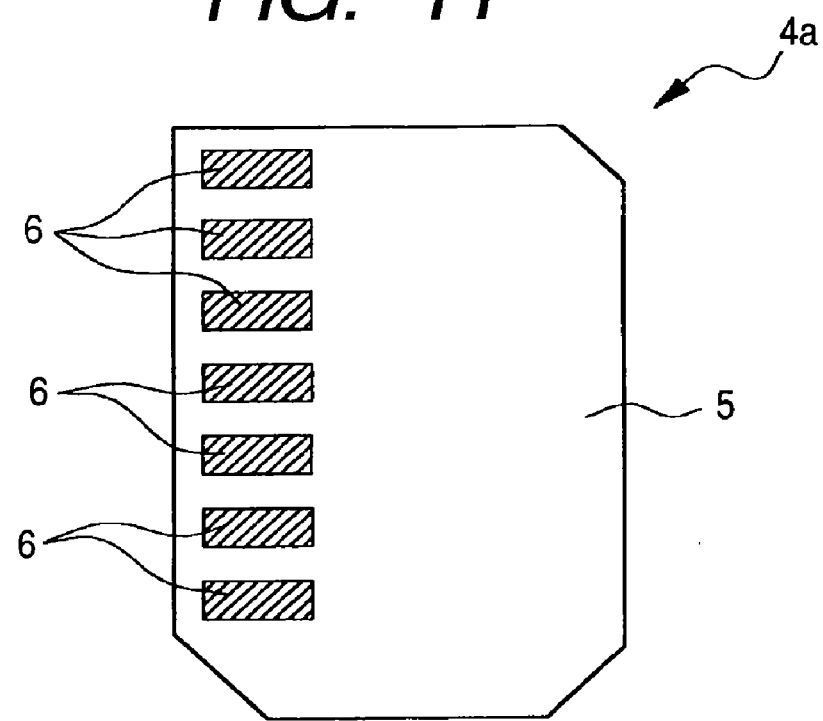
FIG. 11 is a bottom (back side) view of the IC body of FIG. 10.
Figure 12:
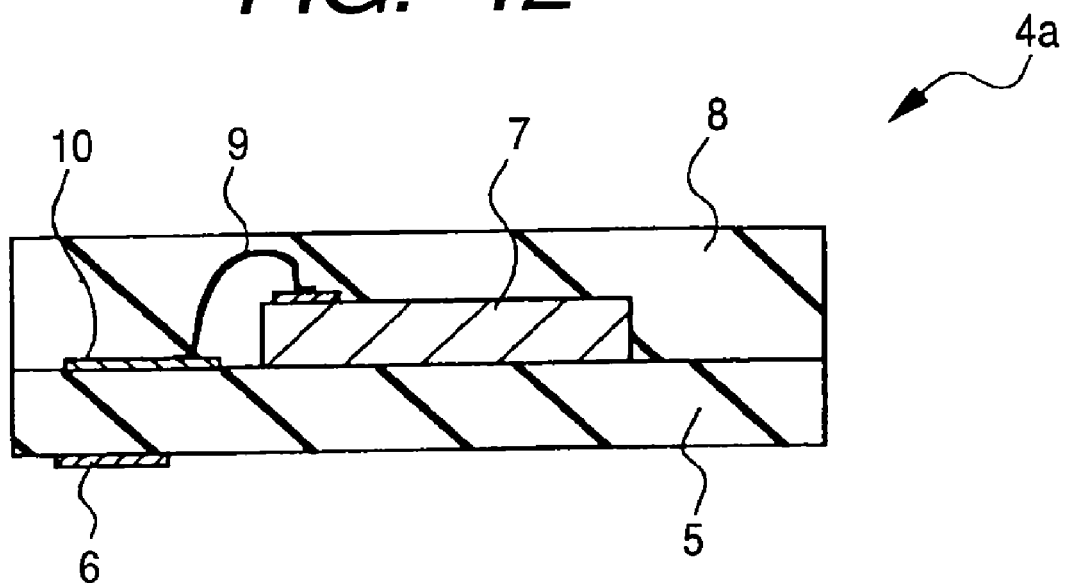
FIG. 12 is a cross-sectional view of the IC body taken along a line C-C of FIG. 10.
Figure 13:
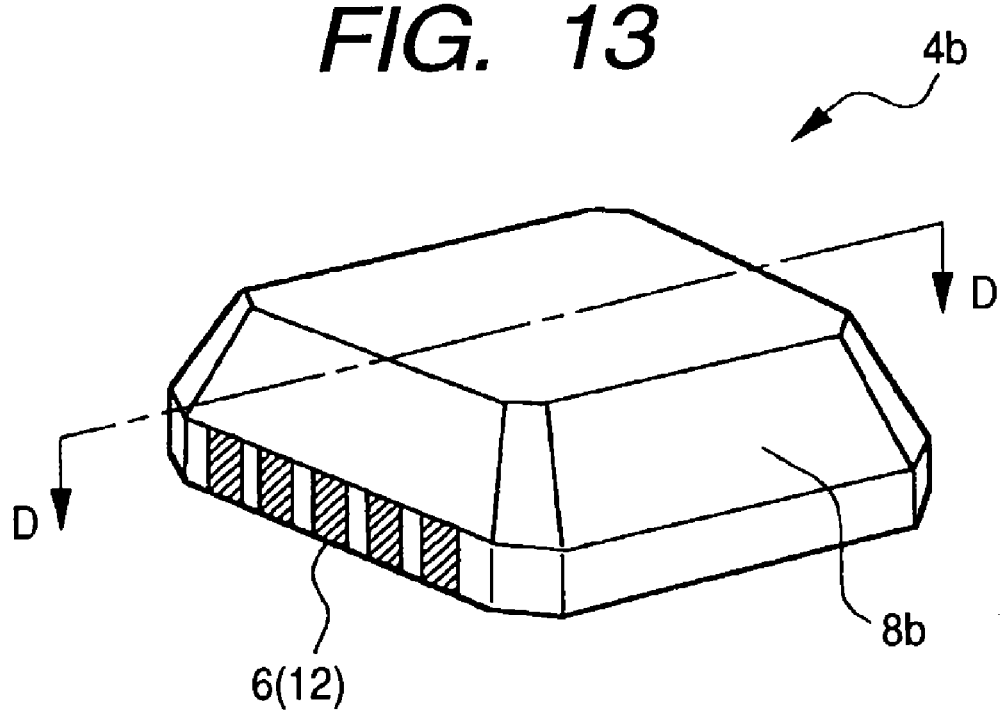
FIG. 13 is a perspective view illustrating the appearance of a further IC body used for the IC card of FIG. 1.
Figure 14:
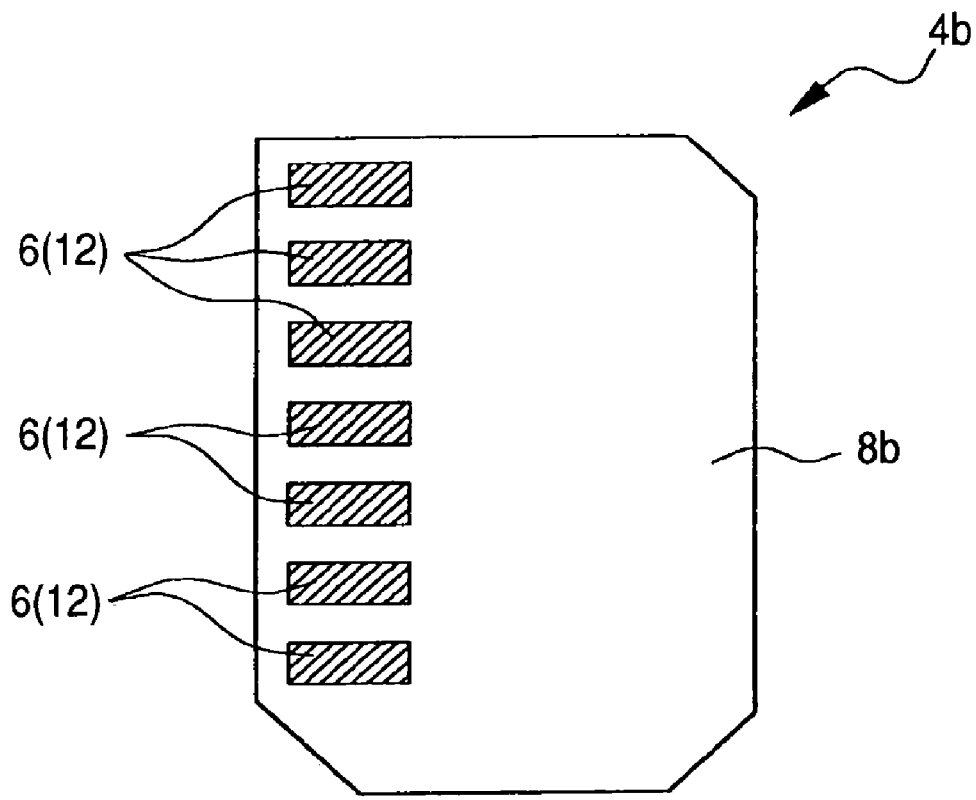
FIG. 14 is a bottom (back side) view of the IC body of FIG. 13.

In this embodiment, the IC body 4 has the semiconductor chip 7 mounted directly on the wiring substrate 5 as described above and is therefore a semiconductor device in the form of COB (chip on board). A variety of semiconductor devices other than that in the COP form are usable as the IC body 4. FIG. 10 is a perspective view illustrating the appearance of another IC body 4a used for the IC card of this embodiment; FIG. 11 is a bottom (back side, first surface) view of the IC body 4a of FIG. 10; FIG. 12 is a cross-sectional view of the IC body 4a taken along a line C-C of FIG. 10; FIG. 13 is a perspective view illustrating the appearance of a further IC body 4b used for the IC card 1 of this embodiment; FIG. 14 is a bottom (back side, first surface) view of the IC body 4b of FIG. 13; and FIG. 15 is a cross-sectional view of the IC body 4b taken along a line D-D of FIG. 13.

The IC body 4a as illustrated in FIGS. 10 to 12 is a semiconductor device in the MAP (mold array package) form. This IC body 4a can be formed, for example, in the following manner. First, a plurality of semiconductor chips 7 are disposed over a wiring substrate 5 and they are each electrically connected to an interconnect 10 of the wiring substrate 5 via a bonding wire 9. Then, the plurality of the semiconductor chips 7 are sealed, in block, with a sealing portion 8 made of a thermosetting resin (block molding method). The sealing portion 8 and the wiring substrate 5 are diced and cut or separated into a piece (IC body 4a), whereby the IC body 4a is manufactured.

Figure 15:
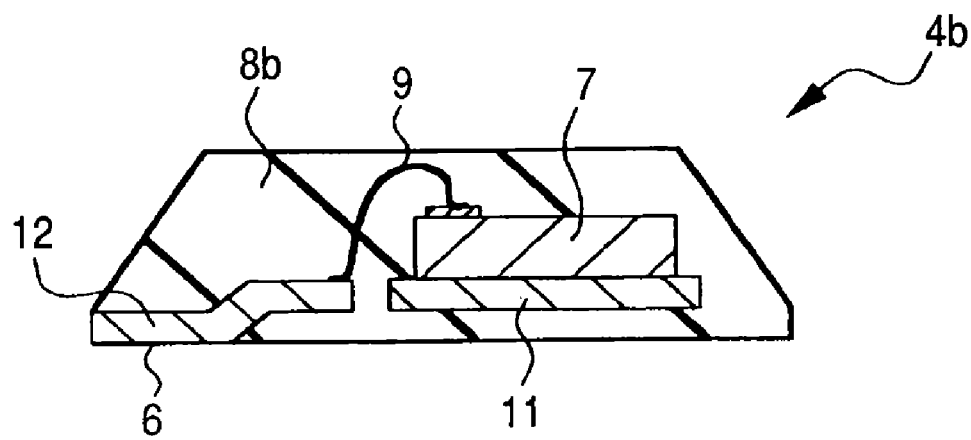
FIG. 15 is a cross-sectional view of the IC body taken along a line D-D of FIG. 13.

The IC body 4b as illustrated in FIGS. 13 to 15 is a semiconductor device manufactured using a lead frame such as QFN (quad flat non leaded package). The IC body 4a can be manufactured, for example, in the following manner. First, a semiconductor chip 7 is mounted over a die pad 11 of a lead frame and an electrode pad of the semiconductor chip 7 is electrically connected to a lead portion 12 of the lead frame via a bonding wire 9. A sealing portion 8b is then formed from a similar thermosetting resin material to that used for the above-described sealing portion 8 so as to cover the semiconductor chip 7, bonding wire 9, die pad 11 and lead portion 12 with the sealing portion 8b. The lead portion 12 has been bent to a fixed shape and an external connection terminal 6 is formed by partially exposing the outer surface of the bent lead portion 12 from the back side of the sealing portion 8b. The lead portion 12 protruded from the side surface of the sealing portion 8b is cut, whereby the IC body 4b is manufactured. Accordingly, the IC body 4b has a structure in which its outer face is formed by the sealing portion 8b made of a thermosetting resin and on the back side, the external connection terminal 6 made of the outer surface of the lead portion 12 is exposed.

Figure 16:
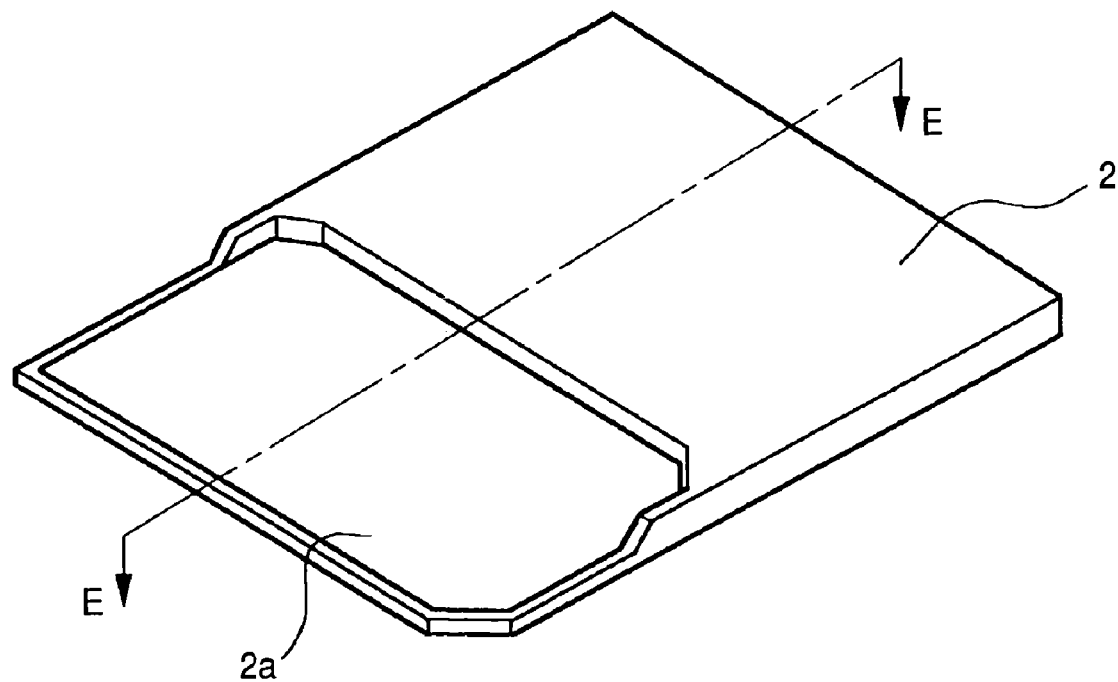
FIG. 16 is a perspective view illustrating the appearance of a case used for the IC card of FIG. 1.
Figure 17:
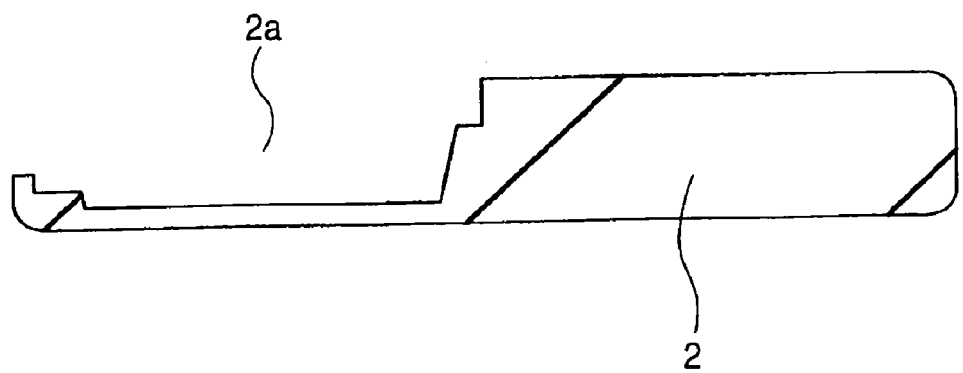
FIG. 17 is a cross-sectional view of the case taken along a line E-E of FIG. 16.

After preparation of the IC body 4 (or 4a or 4b), a case 2 is prepared. FIG. 16 is a perspective view illustrating the appearance of the case 2 used for the manufacture of the IC card 1 of this embodiment. FIG. 17 is a cross-sectional view of the case 2 taken along a line E-E of FIG. 16.

The manufacture of the case 2 may be conducted before, after or simultaneously with the preparation of the IC body 4. The case 2 is made of a thermoplastic resin material. Examples of the usable material include polycarbonate, ABS (acrylonitrile butadiene styrene resin), PBT (polybutylene terephthalate), PPE (polyphenylene ether), nylon, LCP (liquid crystal polymer), and PET (polyethylene terephthalate), and mixtures thereof. The thermoplastic resin material for the formation of the case 2 may contain a glass filler. When the content of the glass filler becomes as high as that of the glass filler in the sealing portion 8, the hardness of the case 2 becomes high, which presumably causes an inconvenience, for example, of damaging Au plating on the surface of an electrode terminal in a slot which a memory card (IC card 1) is inserted in or removed from. It is therefore preferred to adjust the content of the glass filler contained in the case 2 to be less than that of the glass filler in the sealing portion 8. A variety of methods can be used for the formation of the case 2. For example, it can be formed by injection molding using a mold with a cavity having a shape corresponding to that of the case 2. The case 2 has, in the outer shape of a card shape, a structure in which a dent or recess portion 2a having a shape permitting the IC body 4 to fit therein has been disposed.

The IC body 4 is then installed in the recess portion 2a of the case 2. FIGS. 18 to 21 are cross-sectional views of the IC Card 1 during the step of installing the IC body 4 in the case 2 and steps thereafter, and correspond to FIG. 2 and FIG. 17.

Figure 18:
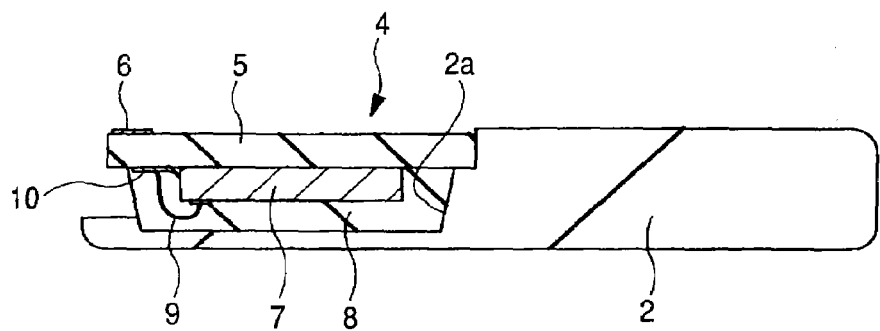
FIG. 18 is a cross-sectional view of the IC card of FIG. 1 during its manufacturing step.

As illustrated in FIG. 18, the IC body 4 is installed (fitted) in the recess portion 2a of the case 2 so as to position the sealing portion 8 on the inner side and the external connection terminal 6 on the outer surface side. The recess portion 2a of the case 2 has a shape corresponding to the IC body 4 so that by fitting the IC body 4 in the recess portion 2a of the case 2, the IC body 4 can be fixed to the case 2. With regards to the positioning of the IC body 4 in the case 2, the IC body in the XY direction (a planar direction parallel to the main surface of the case 2) can be fixed by fitting it in the recess portion of the case 2, while the IC body in the Z direction (direction vertical to the main surface of the case 2) can be fixed by molds 15a and 15b which will be described later. Alternatively, the IC body 4 can be fixed by temporarily adhering the IC body 4 in the recess portion 2a of the case 2 with an adhesive.

Figure 19:
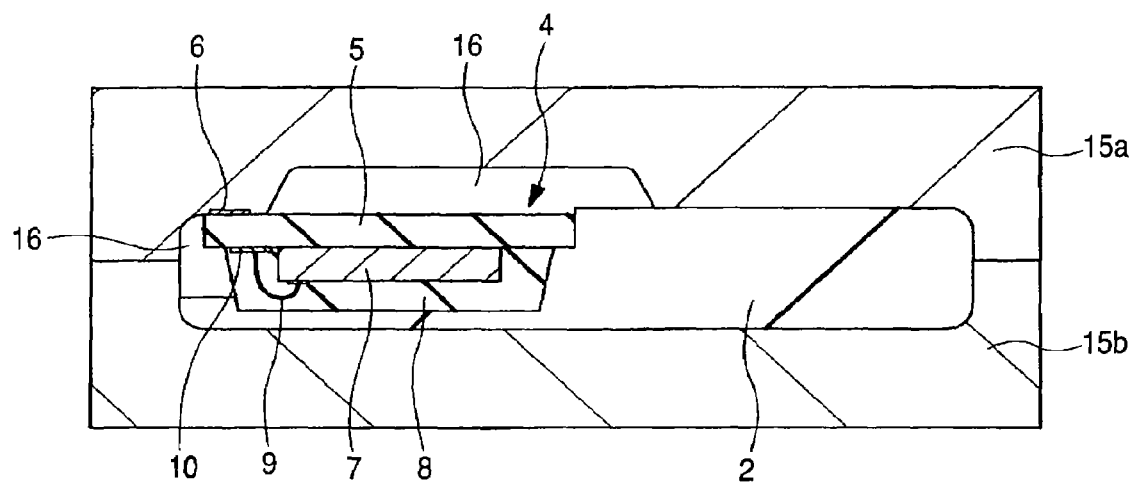
FIG. 19 is a cross-sectional view of the IC card during its manufacturing step following the step of FIG. 18.
Figure 20:
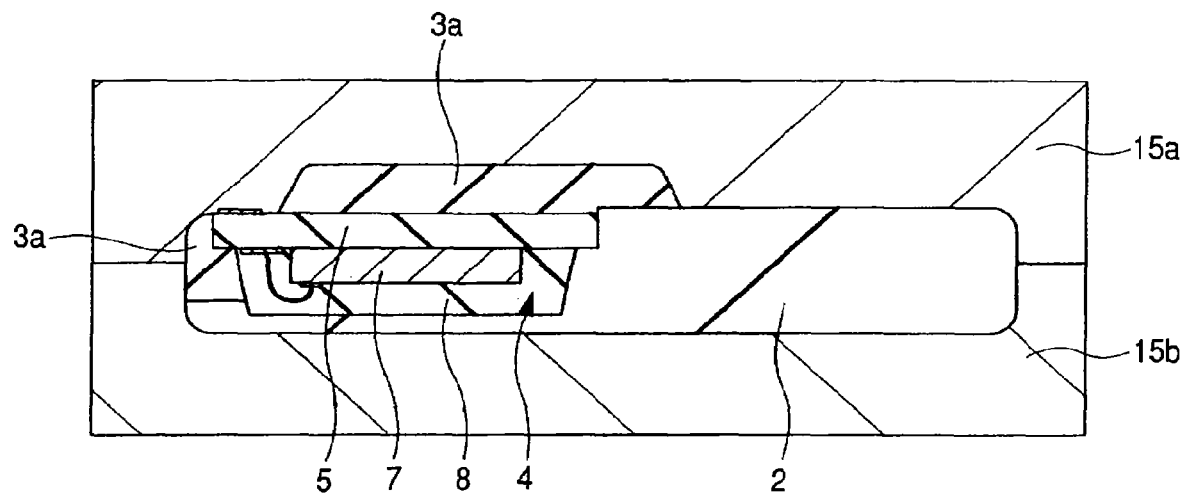
FIG. 20 is a cross-sectional view of the IC card during its manufacturing step following the step of FIG. 19.

As illustrated in FIG. 19, the case 2 having the IC body 4 installed in the recess portion 2a is then sandwiched between the molds 15a and 15b. When the case 2 having the IC body 4 installed therein is disposed between the molds 15a and 15b, a cavity 16 is formed in a region in which a sealing portion 3 is to be formed. As illustrated in FIG. 20, a resin material (molding resin) 3a is introduced (injected) or filled in the cavity 16 by injection molding or the like method. The resin material 3a filled in the cavity 16 is made of a thermoplastic resin material. Examples of the usable material include polycarbonate, ABS (acrylonitrile butadiene styrene resin), PBT (polybutylene terephthalate), PPE (polyphenylene ether), nylon, LCP (liquid crystal polymer), and PET (polyethylene terephthalate) and mixtures thereof. The resin material 3a may contain a glass filler. As in the case 2, however, when the glass filler content becomes as high as that of the sealing portion 8, the hardness of the sealing portion 3 becomes high, which presumably causes an inconvenience, for example, of damaging Au plating on the surface of an electrode terminal in a slot which a memory card (IC card 1) is inserted in or removed from. It is therefore preferred to adjust the glass filler content in the resin material 3a to be less than that in the sealing portion 8. The resin material 3a to be introduced in the cavity 16 preferably has a high fluidity. The glass filler content of the resin material 3a for the formation of the sealing portion 3 is therefore preferably lower than that of the resin material (thermoplastic resin material) for the formation of the case 2.

The temperature of the resin material 3a to be introduced in the cavity 16 upon injection molding ranges, for example, from about 200 to 450° C. The temperature of each of the mold 15a and 15b ranges, for example, from about room temperature to 100° C. The temperature of each of the molds 15a and 15b can be controlled by adjusting the temperature or flow rate of cooling water flowing in the molds 15a and 15b. The temperature of each of the molds 15a and 15b is lower than the melting point or softening point of the resin material of the case 2. Prior to the introduction of the resin material 3a in the cavity 16, the temperature of the case 2 is lower than the melting or softening point of the case 2 so that the case 2 does not lose its original shape by melting or softening. The temperature of the resin material 3a to be introduced in the cavity 16 is higher than the melting or softening point of the case 2. In other words, upon introduction of the resin material 3a in the cavity 16, the resin material 3a is heated in advance to a temperature higher than the softening point of the case 2. An external connection terminal 6 of the IC body 4 is in contact with the surface of the mold 15a to prevent the introduction of the resin material 3a over the external connection terminal 6.

The resin material (thermoplastic resin material) introduced in the cavity 16 by injection molding covers an exposed surface (back side surface of the wiring substrate 5, surface of the wiring substrate 5 and a portion of the sealing portion 8) except the external connection terminal 6 of the IC body 4 and fills the space, if any, between the IC body 4 and case 2. The resin material 3a also covers at least partially over the surface of the case 2 on the side on which the IC body 4 is installed. When the resin material 3a introduced into the cavity 16 is brought into contact with the case 2, it increases the temperature of the contacted part of the case 2. The case 2 is made of a thermoplastic resin so that it has a relatively low thermal conductivity. In the case 2, therefore, only the surface of the case 2 brought into contact with the resin material 3a introduced in the cavity 16 and a portion in the vicinity thereof (for example, a portion of from several µm to hundred µm deep from the surface) are melted or softened by heating (heating to the melting or softening point of the case material or greater) and the case 2 reacts or is mixed with the resin material 3a. It is more preferred that the case 2 and the resin material 3a are made of respective materials having high affinity each other, because if so, the molten or softened surface of the case 2 reacts or is mixed with the resin material 3a and they adhere (are welded) easily. In order to improve the reactivity or adhesion between the surface of the case 2 and the resin material 3a, thermoplastic resin materials similar in kind can be used therefor. It is also possible to use thermoplastic resin materials different in kind for the case 2 and the resin material 3a.

The resin material 3a is injected in the cavity 16 while covering the semiconductor chip 7 of the IC body 4 or the bonding wire 9 with the sealing portion 8 made of a thermosetting resin so that the resin material 3a heated to high temperature is not brought into contact with the semiconductor chip 7 of the IC body 4 or bonding wire 9. In addition, the sealing portion of the IC body 4 is formed from a thermosetting resin material so that contact, with the sealing portion 8, of the resin material 3a heated to high temperature causes neither melting nor softening of the sealing portion 8. The injection of the resin material 3a (molding step of the sealing portion 3) does not adversely affect the semiconductor chip 7 of the IC body 4, the bonding wire 9, a connection between the semiconductor chip 7 and the binding wire 9 or a connection between the wiring substrate 5 and the bonding wire 9.

Figure 21:
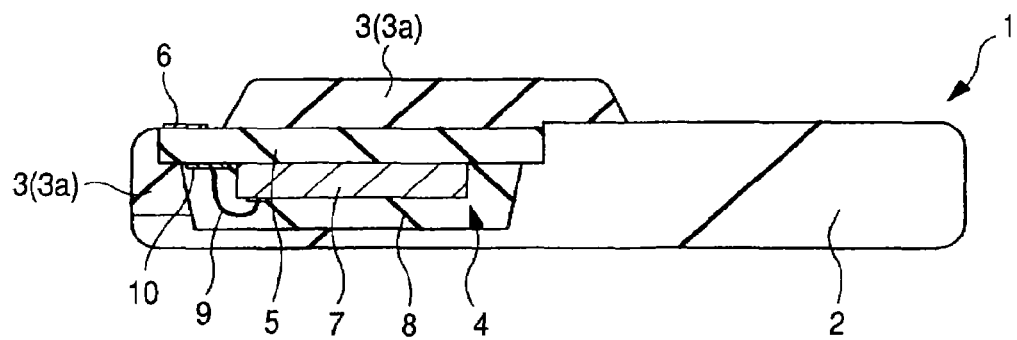
FIG. 21 is a cross-sectional view of the IC card during its manufacturing step following the step of FIG. 20.

After the resin material 3a is filled in the cavity 16, the temperature of the resin material 3a in the cavity 16 gradually lowers because the molds 15a and 15b have a relatively low temperature. With a temperature decrease, the resin material 3a made of a thermoplastic resin material cures to be a sealing portion 3. As described above, the surface portion of the case 2 and the resin material 3a are molten, reacted or mixed so that after the resin material 3a and the surface portion of the case 2 are cooled and cured (solidified), the surface portion of the case 2 adheres firmly with and therefore is formed integral with the sealing portion 3. The surface portion of the case 2 and sealing portion 3 are welded so that the case 2 is formed integral with the IC body 4 via the sealing portion 3, whereby a high strength IC card 1 is formed. IC cards are thin and bent easily so that there is fear that peeling of the IC body 4 occurs without the sealing portion 3. Such a fear is however unnecessary in this embodiment, because the sealing portion 3 is formed integral with the case 2 and it supports the IC body 4 firmly as if it sandwiches the IC body 4. The sealing portion 3 is formed to cover a region of the IC body 4 except the external connection terminal 6 and to make the outside shape of the IC card 1 a substantially card shape. Then, the molds 15a and 15b are removed (separated) and the IC card 1 is taken out. The outer face of the IC card 1 is made of a thermoplastic resin so that it can be easily separated from the molds. In the above-described manner, the IC card 1 of this embodiment as illustrated in FIG. 21 is manufactured.

In this Embodiment, the IC body 4 installed in the case 2 is sealed with the sealing portion 3 so that the IC body is formed integral with the case. Therefore, no space exists in the IC card, which enables heightening of the strength of the IC card and prevention of the penetration of water therein.

In this Embodiment, the case 2 and the sealing portion 3 of the IC card 1 are each made of a thermoplastic resin material, while the sealing portion of the IC body 4 is made of a thermosetting resin material. Use of an inexpensive molding resin is effective for reducing the material cost, but the resin material for the sealing portion 8 which seals the semiconductor chip 7 is required to have properties such as weather resistance, high adhesion and chemical stability (slow decomposition of the resin owing to a time-dependent change and less degassing). To satisfy the above-described requirement, a silica-filler-containing epoxy resin is preferred as a material for the sealing portion 8. This makes it possible to improve the reliability of the IC card 1. As a resin material for molding the case 2 and the sealing portion 3 of the IC card 1, preferred is the use of a thermoplastic resin (thermoplastic plastic) which is more inexpensive and permits shortening of the time (TAT (turn around time)) spent for the sealing step. This makes it possible to reduce the manufacturing cost of the semiconductor device.

For the improvement of mass productivity, shortening of the time spent for molding is required. Since the curing of thermosetting resins proceeds with polymerization reaction which is a chemical process, it is difficult to increase the curing rate of the resins and in turn, improve the productivity. In thermoplastic resins, on the other hand, curing of the resins is attained by depriving thermal energy from the resin, making it possible to complete the curing more quickly compared with the thermosetting resins. In this Embodiment, time spent for molding, particularly, for curing of a resin can be reduced by adopting a thermoplastic resin as a molding resin of the case 2 and sealing portion 3. This leads to shortening of the manufacturing time of the IC card.

Thermoplastic resins have a lower modulus of elasticity than epoxy resins. In this Embodiment, use of a thermoplastic resin as a molding resin of the case 2 and sealing portion 3 makes it possible to form the outer face of the IC card from this thermoplastic resin having a relatively low modulus of elasticity, whereby upon insertion or removal of the IC card in or from a slot of an electronic device, it is possible to avoid such a problem as damage of coating such as Au plating formed over the electrode surface in the slot. Use of the thermoplastic resin is therefore advantageous.

In this Embodiment, during the molding step of the sealing portion 3, by using a thermoplastic resin for the case 2 serving as a base and the molding resin (resin material 3a) and setting the injection temperature of the molding resin higher than the softening point of the base (case 2), fusion bonding occurs at the interface between the molding resin with the base (case 2), which facilitates the retention of the adhesion strength at the interface between the base (case 2) and the molding resin (sealing portion 3) and at the same time, enables prevention of water penetration from the interface.

Thermoplastic resins are however characterized by that compared with thermosetting resins which cause a chemical change upon curing, thermoplastic resins usually have low chemical stability after curing and have low weather resistance and adhesion force. It is therefore preferred to use a thermosetting resin such as epoxy resin as a resin material for the sealing portion of the semiconductor chip 7. This makes it possible to improve the reliability of the IC card.

It is necessary to omit an exposed solder connection from the constitution in order to eliminate a limitation to the processing temperature upon molding (upon molding of the sealing portion 3) and select a molding resin (resin material 3a) more freely. As countermeasures against such a problem, first one is to form a connection between the semiconductor chip and wiring substrate by using a high-melting-point metal. In this Embodiment, the semiconductor chip 7 and wiring substrate 5 are electrically connected by employing the wire bonding connection method using a metal wire (bonding wire 9) formed from a high-melting-point metal such as Au. The connection having such a constitution has the merit of withstanding high processing temperatures. A second countermeasure is to, supposing that a solder which is a low-melting-point metal is used for the formation of the connection between the semiconductor chip and the wiring substrate, protect the connection in advance with a resin which is insulative and more temperature resistant than the solder so that the connection is not damaged by the injection of the molding resin even if the solder is molten by the processing temperature upon molding. One specific example of this countermeasure is to install a package such as semiconductor chip using a solder bump, CSP or BGA as described later in Embodiment 3 and at the same time, insulate between terminals by an underfill resin in order to protect these terminals. By carrying out any one of the above-described countermeasures, it is possible to select the molding resin (resin material 3a) more freely.

Thermosetting resins cure by the polymerization reaction caused by heating so that after curing, they can withstand even at a temperature higher than the processing temperature upon curing without softening. Thermoplastic resins, on the other hand, softens by heating even after curing so that a resin having a sufficiently high softening point must be selected in order to attain heat resistance required for the product. Supposing that a final product is required to have predetermined temperature resistance, the temperature upon molding step using a thermoplastic resin must be set higher than that upon molding step using a thermosetting resin. In the process (molding step) using a thermoplastic resin, it is therefore effective to adopt any one of the above-described countermeasures to eliminate the limitation to the processing temperature, because the processing temperature upon injection of a thermoplastic resin must be set higher (for example, from 200 to 450° C.) than that upon injection of a thermosetting resin in order to attain fusion bonding of the molding resin (sealing portion 3) and the base (case 2).

When a material having a smaller thermal expansion coefficient compared with that of the wiring substrate 5 or molding resin (sealing portion 3) is used for the semiconductor chip 7, it is effective to cover in advance the main surface of the semiconductor chip 7 with the sealing portion 8 made of a resin having a thermal expansion coefficient between that of the semiconductor chip 7 and that of the molding resin (sealing portion 3) in order to reduce a thermal stress which will otherwise occur owing to unconformity of the thermal expansion coefficient between the semiconductor chip 7 and the other member. In this Embodiment, the reliability of the IC card 1 can be improved further by forming the sealing portion 8 so as to cover the semiconductor chip 7 with a silica-filler-containing epoxy resin, thereby adjusting the thermal expansion coefficient.

The reliability of the IC card 1 can be improved further by covering the main surface of the semiconductor chip 7 in advance with the sealing portion 8 made of a resin having a smaller alkali ion concentration compared with that of the molding resin (sealing portion 3) in order to prevent contamination of the semiconductor chip 7 with an alkali ion contained in an organic resin and a deterioration in electric properties due to the contamination.

Embodiment 2

Figure 22:
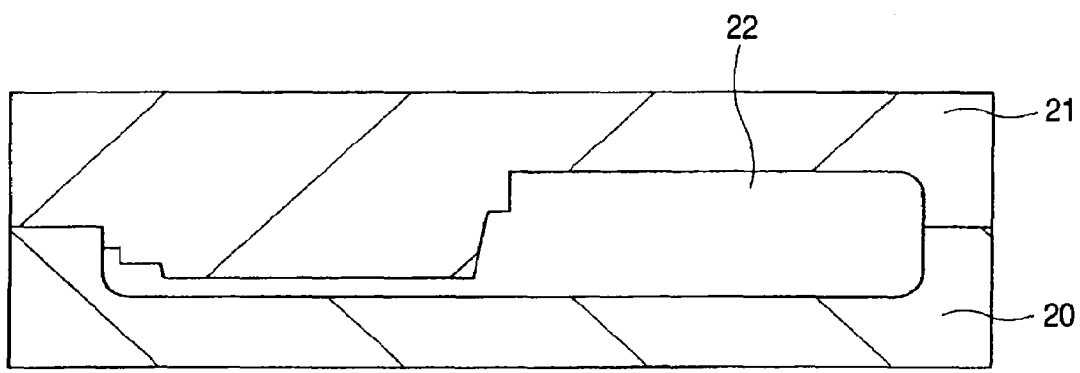
FIG. 22 is a cross-sectional view of an IC card according to another embodiment of the present invention during its manufacturing step.
Figure 23:
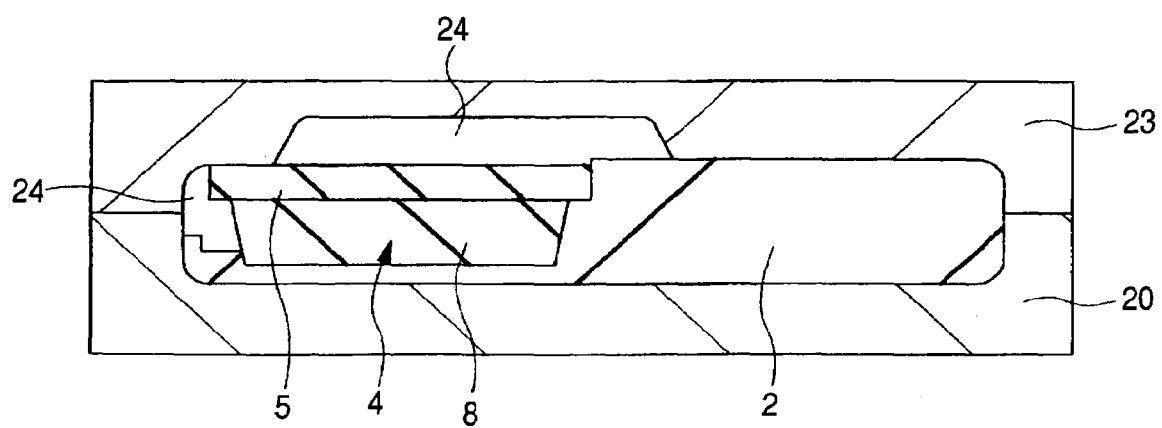
FIG. 23 is a cross-sectional view of the IC card during its manufacturing step following the step of FIG. 22.
Figure 24:
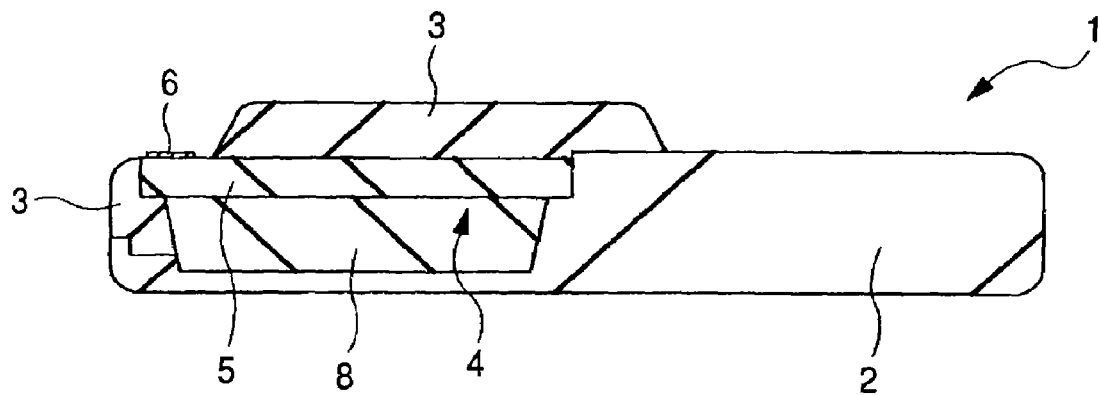
FIG. 24 is a cross-sectional view of the IC card during its manufacturing step following the step of FIG. 23.

FIGS. 22 to 24 are cross-sectional views of an IC card according to another embodiment of the present invention during its manufacturing steps. To facilitate the understanding, the inside structure (semiconductor chip 7, bonding wire 9 and interconnect 10) of the IC body 4 is not illustrated in FIGS. 23 and 24.

In Embodiment 1, the IC card 1 was manufactured by installing the IC body 4 in the case 2 prepared in advance, and forming the case 2 integral with the IC body 4 by molding the sealing portion 3. In this Embodiment, on the other hand, molding of the case 2, installing of the IC body 4 in the case 2, and molding of the sealing portion 3 are carried out by injecting a resin material twice in a mold.

As illustrated in FIG. 22, a mold (base mold, lower mold) 20 and another mold (upper mold) 21 for the formation of a case are prepared as illustrated in FIG. 22. A cavity 22 having a shape corresponding to the case 2 is formed by the mold 20 and mold 21. A resin material made of a thermoplastic material is then introduced or injected into the cavity 22 by injection molding. The resin material to be introduced in the cavity 22 is made of a thermoplastic material. Examples of the usable material include polycarbonate, ABS, PBT, PPE, nylon, LCP and PET, and mixtures thereof. By this introduction, the case 2 having a similar shape to that of Embodiment 1 is formed (molded).

Then, the mold 21 is removed from the mold 20, followed by installing the IC body 4, which has been prepared (manufactured) in advance, in a recess portion 2a of the case 2 remaining over the mold 20 and having the upper surface thereof exposed. The IC body 4 can be fixed to the case 2, for example, by fitting the IC body 4 in the recess portion of the case 2. As illustrated in FIG. 23, a mold (upper mold) 23 for the formation of a sealing portion is then attached to the mold 20. By these molds 20 and 23, a cavity 24 having a shape corresponding to the formation region of the sealing portion 3 is formed. It is also possible, after removal of the case 2 from the mold 20, to fit the IC body 4 in the recess portion of the case 2 and then return the case having the IC body 4 therein to the mold 20. Or, after removal of the case 2 from the mold 20, the IC body 4 may be fitted in the recess portion of the case 2, followed by installing the case 2 having the IC body 4 therein in a mold other than the mold 20. In the latter case, the mold in which the case 2 having the IC body 4 therein is to be installed may have a dent similar to or different from that of the mold 20. Anyway, the mold may have at least a dent capable of stably fixing or keeping therein the case 2 having the IC body 4 installed therein.

A resin material made of a thermoplastic resin material is then introduced or injected in the cavity 24 by injection molding. The resin material to be introduced in the cavity 24 is made of a thermoplastic material. Examples of the usable material include polycarbonate, ABS, PBT, PPE, nylon, LCP and PET, and mixtures thereof. By this step, a sealing portion 3 is formed (molded). The mold 20 and mold 23 are removed (separated), whereby the IC card 1 of this embodiment as illustrated in FIG. 24 is manufactured.

It is more preferred to use the same material as the resin material to be filled in the cavity 22 for the formation of the case 2 and the resin material to be filled in the cavity 24 for the formation of the sealing portion 3, because if so, the case 2 and sealing portion 3 can be molded successively by using the same injection molder. This makes it possible to heighten the adhesion between the case 2 and sealing portion 3, thereby improving the strength of the IC card 1 and at the same time, to reduce the manufacturing time and manufacturing cost of the IC card 1.

According to this Embodiment, the molding of the case 2, installing of the IC body 4 and the molding of the sealing portion 3 can be carried out successively so that a manufacturing time and manufacturing cost of the IC card can be reduced. In addition, only by changing the upper mold, the IC card can be manufactured by twice injection molding by using the same injection molder so that the manufacturing steps of the IC card can be simplified further.

Embodiment 3

In Embodiment 1, described was the manufacture of the IC card 1 by mounting the semiconductor chip 7 over the wiring substrate 5, carrying out wire bonding, and forming the sealing portion 8 so as to cover the semiconductor chip 7 and the bonding wire 9. In this embodiment, on the other hand, mounting of the semiconductor chip 7 over the wiring substrate 5 by flip chip connection (flip chip bonding) will be described.

Figure 25:
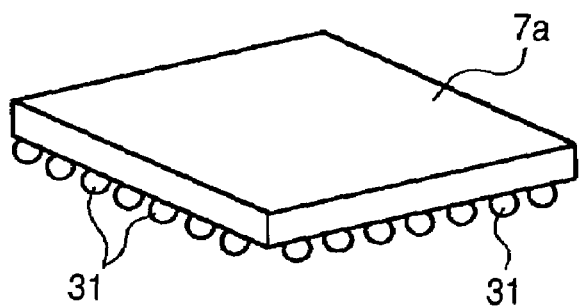
FIG. 25 is a perspective view illustrating the appearance of a semiconductor chip used for an IC card according to a further embodiment of the present invention.
Figure 26:
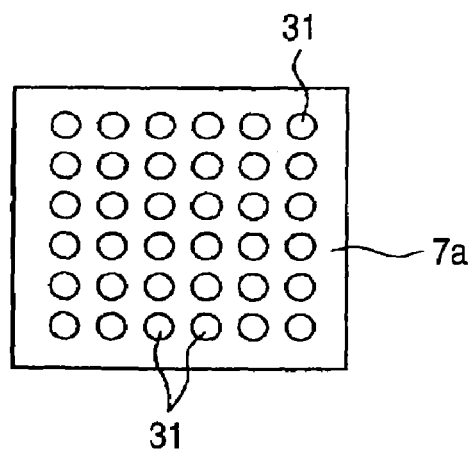
FIG. 26 is a plan (bottom) view of the semiconductor chip of FIG. 25.
Figure 27:
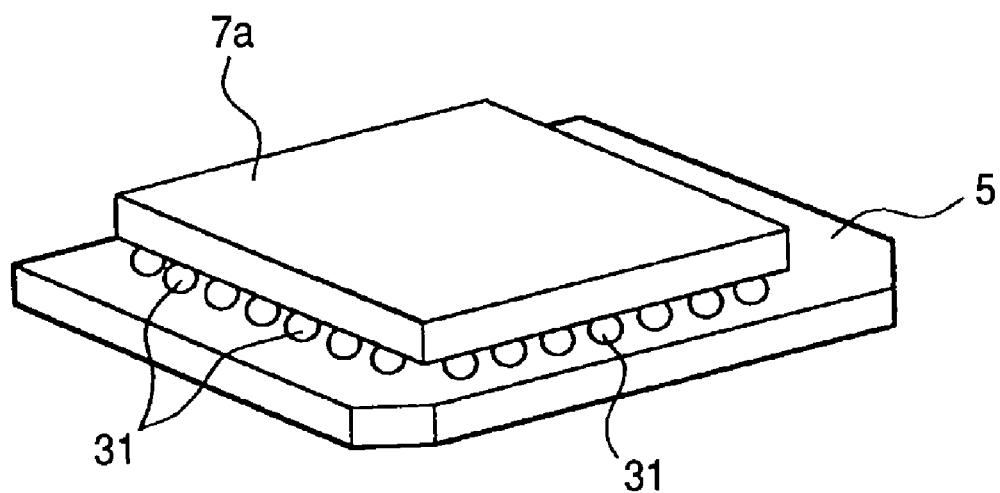
FIG. 27 is a perspective view illustrating the semiconductor chip of FIG. 25 mounted on a wiring substrate.
Figure 28:
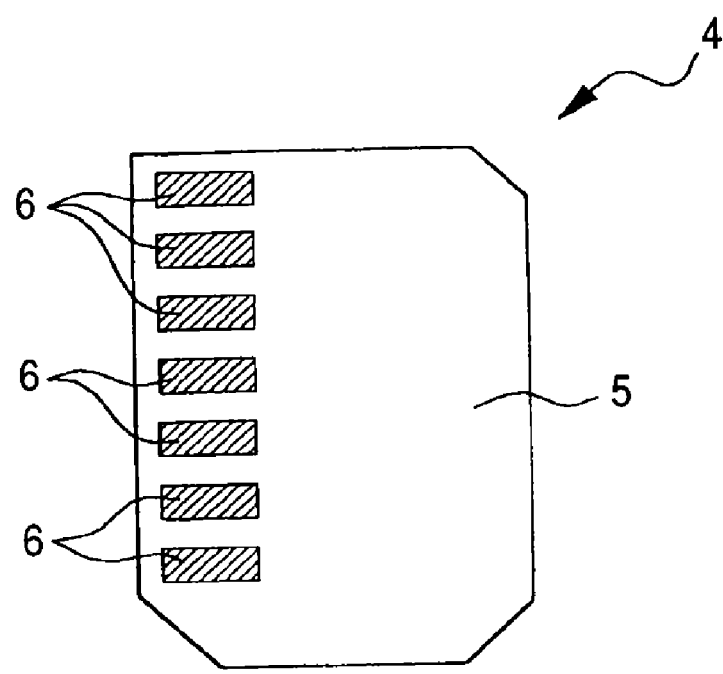
FIG. 28 is a bottom view of FIG. 27.
Figure 29:
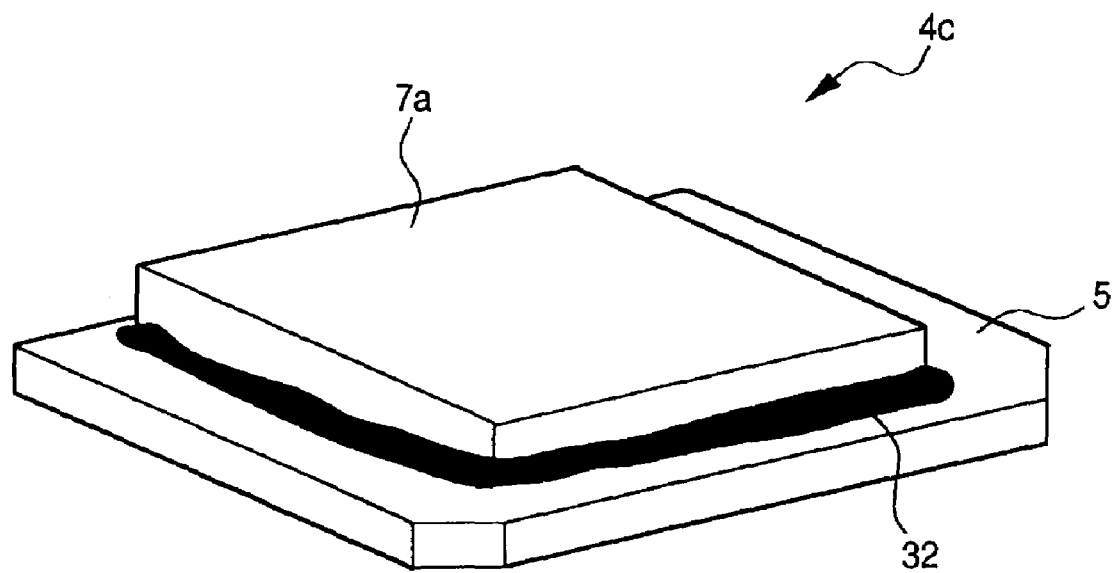
FIG. 29 is a perspective view illustrating the appearance of the IC body.

FIG. 25 is a perspective view illustrating the appearance of a semiconductor chip 7a used in this embodiment; and FIG. 26 is its plan (bottom) view. FIG. 27 is a perspective view illustrating the semiconductor chip 7a of FIG. 25 or FIG. 26 mounted over the wiring substrate 5; and FIG. 28 is its bottom view. FIG. 29 is a perspective view illustrating the appearance of the IC body 4a of this embodiment.

As illustrated in FIGS. 25 and 26, over one of the main surfaces of the semiconductor chip 7a, a plurality of solder bumps (bump electrodes) 31 electrically connected to a semiconductor device inside of the semiconductor chip 7a are formed. As illustrated in FIGS. 27 and 28, such semiconductor chip 7a is installed or mounted over the surface (main surface) of the wiring substrate 5 by flip chip connection. Described specifically, the semiconductor chip 7a is electrically connected to the interconnect of the wiring substrate 5 via the solder bumps 31 and moreover, electrically connected to an external connection terminal on the back side of the wiring substrate 5 via a through-hole of the wiring substrate 5. As illustrated in FIG. 29, a sealing portion made of a thermosetting resin material (for example, a silica-filler-containing epoxy resin), which is an underfill resin (sealing portion) 32 here, is formed to fill between the semiconductor chip 7a and the wiring substrate 5 and cover the solder bumps 31 connecting the semiconductor chip 7a and wiring substrate 5, whereby an IC body 4c as illustrated in FIG. 29 is manufactured. By forming the underfill resin (sealing portion) 32, melting of the solder bump 31 by an injected resin can be prevented in the subsequent molding step of the sealing portion 3, and the solder bumps 31 can be insulated each other so that they are not brought into contact each other even if they are melted by the injected resin. Upon formation of the sealing portion 32, it is demanded that a processing temperature does not exceed the melting point of the solder bumps 31 and the completed sealing portion 32 has properties capable of withstanding a temperature at least as high as the melting point of the solder bumps 31. Use of a thermosetting resin as the underfill resin 32 is preferred in order to satisfy the above-described demands. Use of a thermosetting resin facilitates completion of the thermosetting step at a temperature not greater than the melting point of the solder bumps 31 in the underfilling step and at the same time, preparation of the sealing portion 32, which has completed the thermosetting reaction, having the properties capable of withstanding the molding step using a thermoplastic resin and using the melting point of the solder bumps 31 or higher.

Figure 30:
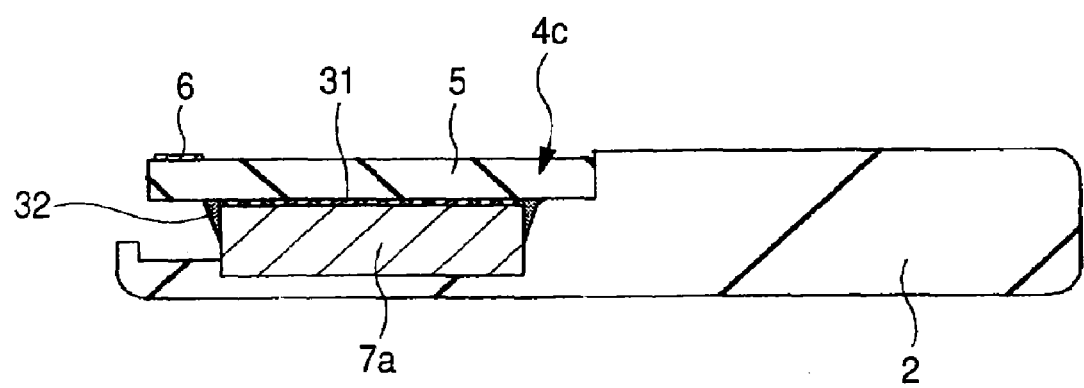
FIG. 30 is a cross-sectional view of an IC card according to a still further embodiment of the present invention during its manufacturing step.
Figure 31:
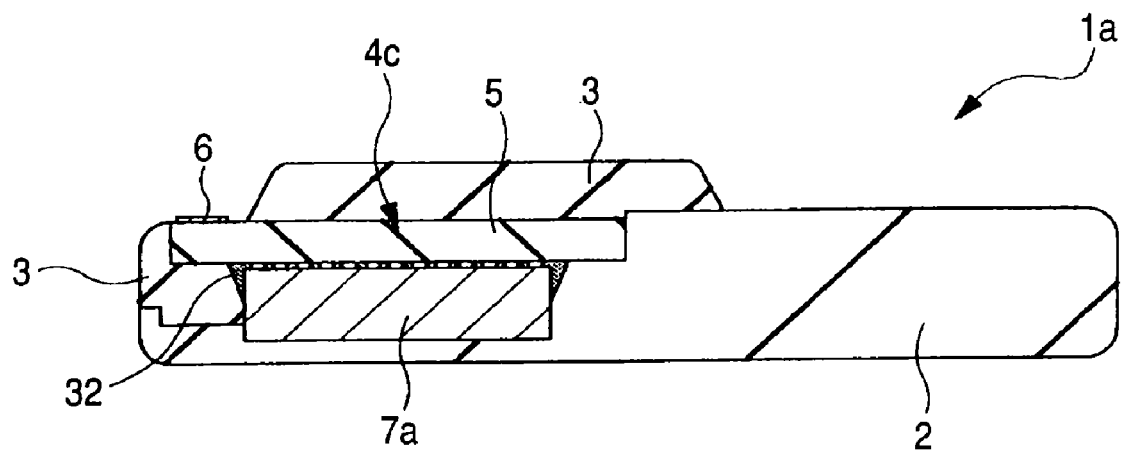
FIG. 31 is a cross-sectional view of the IC card during its manufacturing step following the step of FIG. 30.
Figure 32:
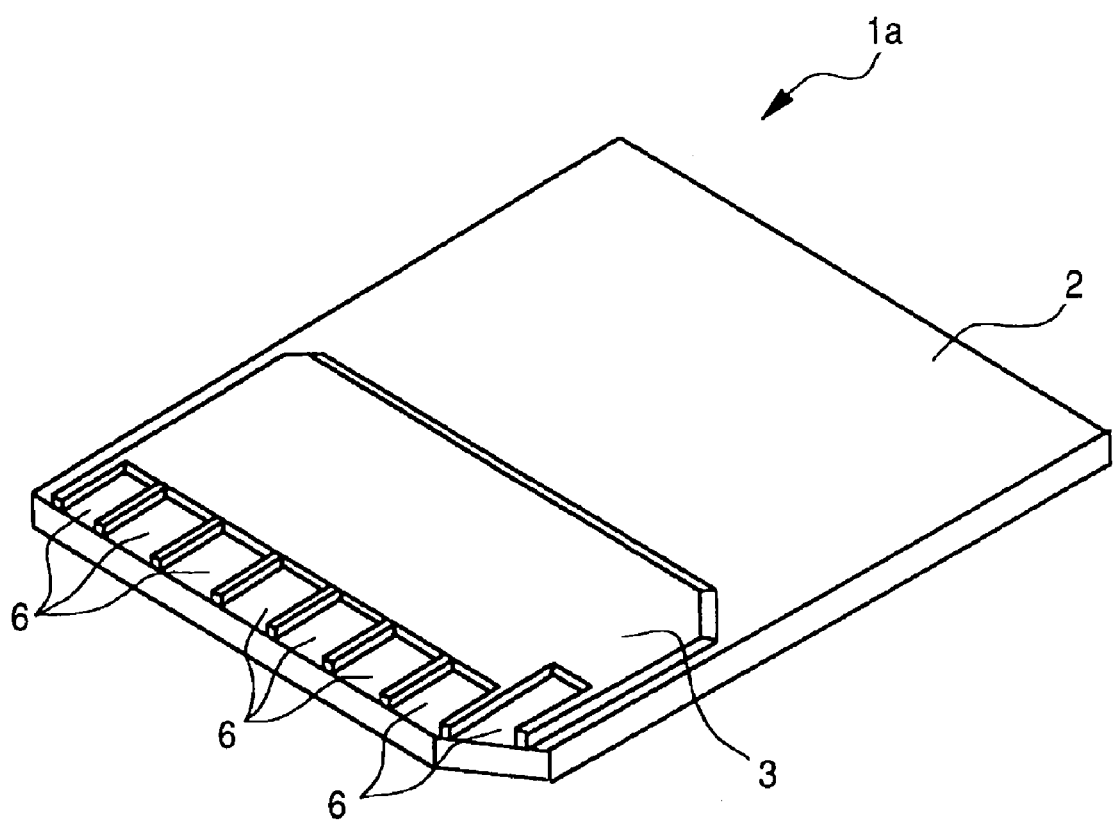
FIG. 32 is a perspective view of the IC card of FIG. 31.

FIGS. 30 to 32 are cross-sectional views and perspective view illustrating the manufacturing steps of the IC card according to this embodiment. FIG. 32 corresponds to the perspective view of the IC card of FIG. 31; and FIGS. 30 to 31 are cross-sectional views.

As illustrated in FIG. 30, the IC body 4c is installed (fitted) in a recess portion of a case 2 made of a thermoplastic resin material in a similar manner to that employed in Embodiment 1. The material and formation method of the case 2 and installing method of the IC body 4a in the recess portion of the case 2 are substantially similar to those employed in Embodiment 1 so that a description on them is omitted.

As in Embodiment 1, a sealing portion 3 made of a thermoplastic resin material is formed by injection molding so as to cover the exposed surface of the IC body 4c other than the external connection terminal 6 and form the case 2 integral with the IC body 4c, whereby the IC card 1a of this embodiment as illustrated in FIGS. 31 and 32 are manufactured. The material and the formation method of the sealing portion 3 are substantially similar to those of Embodiment 1 so that a description on them is omitted.

In this Embodiment, terminals or connections, such as solder bumps 31, whose exposure to high temperatures is not desirable, are protected and insulated in advance by using a sealing portion made of a thermosetting resin, the underfill resin 32 in this embodiment, so as to prevent the connections from being damaged by the injection of a molding resin (resin material 3a) upon molding of the sealing portion 3. It is therefore possible to appropriately prevent the connections such as solder bumps 31 from being damaged upon molding of the sealing portion 3, and in addition to select the molding resin (resin material 3a) more freely.

Also in this Embodiment, the whole surface of the semiconductor chip 7a can be covered with a thermosetting resin material (material of the underfill resin 32) as in Embodiment 1 upon formation of the underfill resin (sealing portion) 32.

In this Embodiment, formation of the IC body 4c by mounting, over the wiring substrate 5, the semiconductor chip 7a having bump electrodes was explained. Alternatively, the IC body 4c can be manufactured by mounting, as in the semiconductor chip 7a, a semiconductor chip (semiconductor device) formed as a package such as BGA (ball grid array) or CSP (chip size (scale) package) over the wiring substrate 5. Also in this case similar to the mounting of the semiconductor chip 7a, the connections such as solder bumps may be covered with an underfill resin made of a thermosetting resin material.

Embodiment 4

In Embodiment 1, the external connection terminal 6 was formed on the back side surface of the wiring substrate 5, but the back side surface of the wiring substrate 5 and the surface of the external connection terminal are almost flat. In order to form the sealing portion 3 so as to expose only the external connection terminal, the sealing portion 3 must be formed so as to cover a region, other than the external connection terminal 6, on the back side surface of the wiring substrate 5. In the IC card 1 thus manufactured, the surface of the sealing portion 3 is a little protruded relative to the surface of the external connection terminal 6 and a step difference appears on the surface of the IC card on the side of the external connection terminal 6. In this Embodiment, a description will be made of an IC card having a planarized surface on the side of the external connection terminal.

Figure 33:
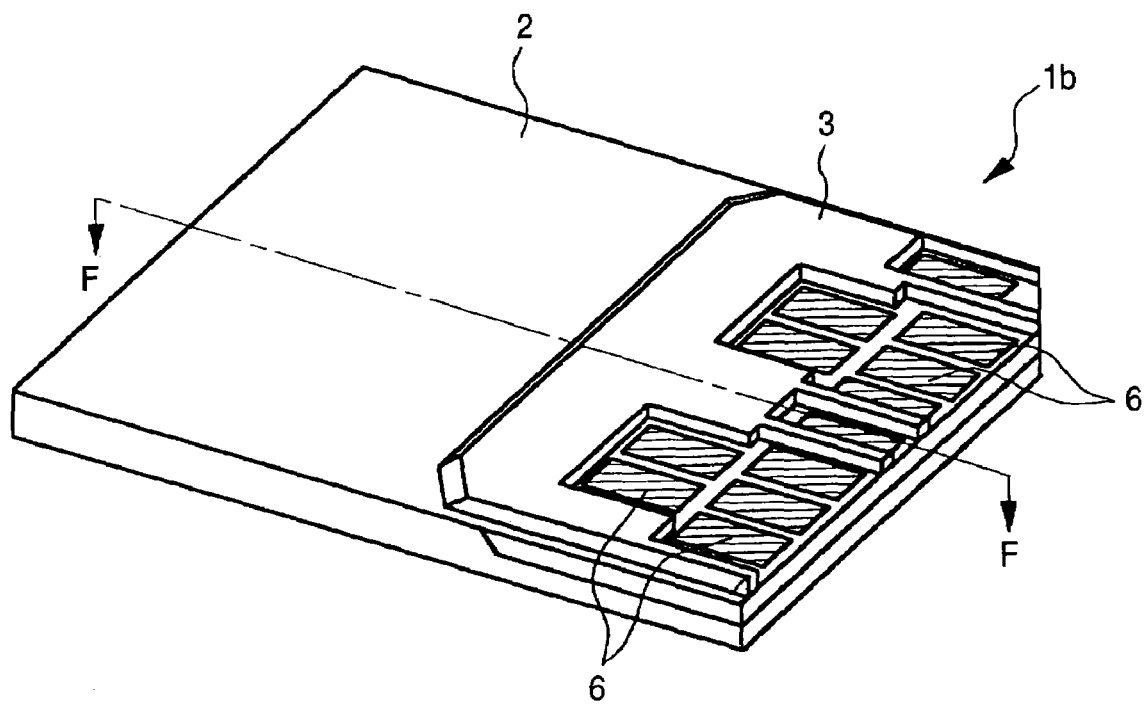
FIG. 33 is a perspective view illustrating the appearance of an IC card according to a still further embodiment of the present invention.
Figure 34:
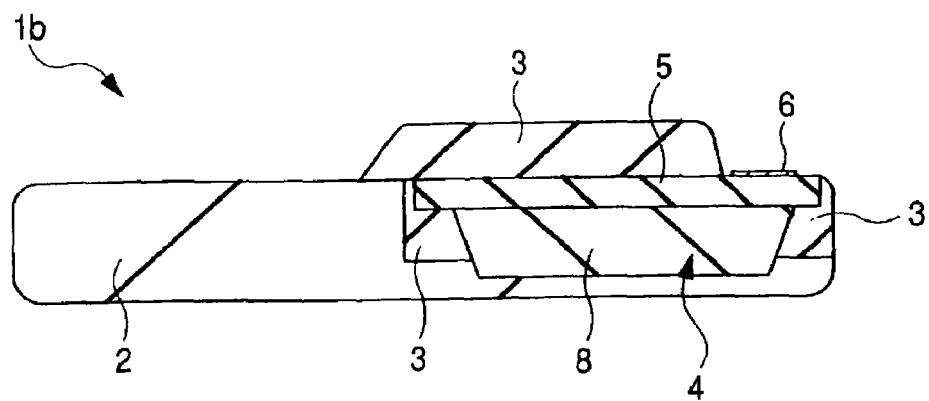
FIG. 34 is a cross-sectional view of the IC card taken along a line F-F of FIG. 33.
Figure 35:
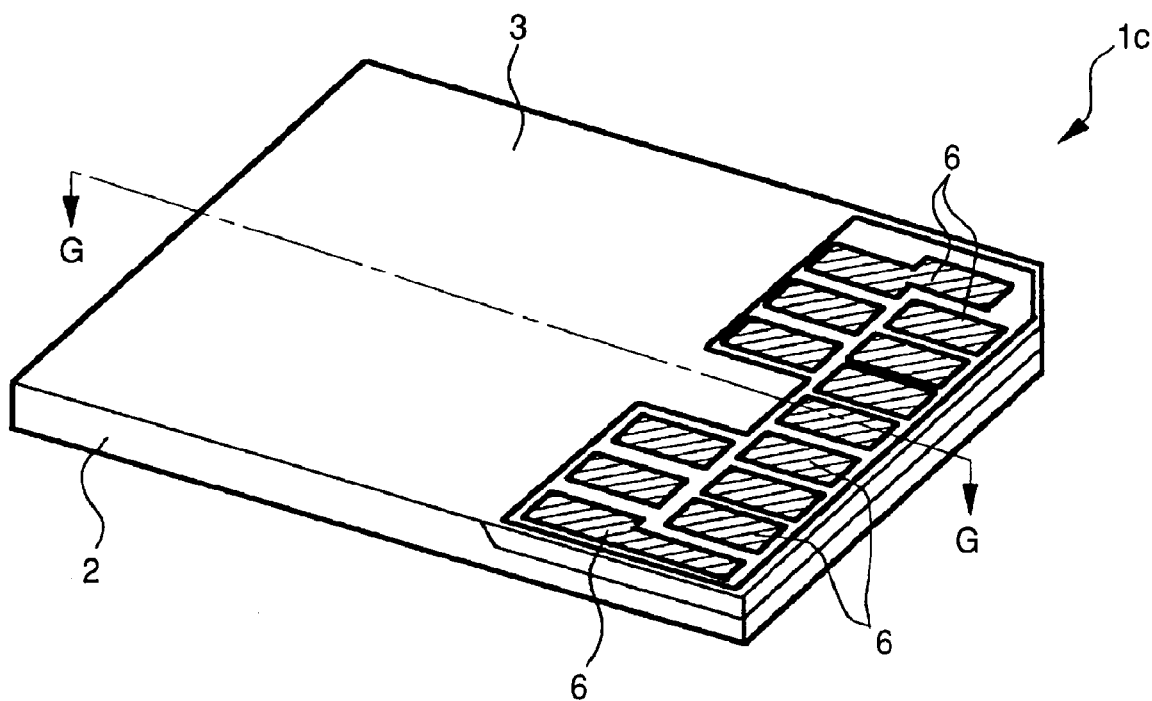
FIG. 35 is a perspective view illustrating the appearance of an IC card according to a still further embodiment of the present invention.
Figure 36:
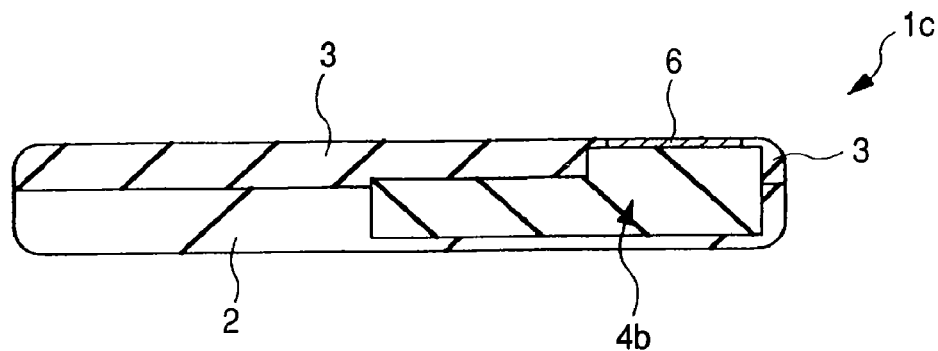
FIG. 36 is a cross-sectional view of the IC card taken along a line G-G of FIG. 35.

FIG. 33 is a perspective view illustrating the appearance of an IC card according to the above-described Embodiment 1; and FIG. 34 is a cross-sectional view of the IC card taken along a line F-F of FIG. 33. FIG. 35 is a perspective view illustrating the appearance of the IC card according to the present embodiment; and FIG. 36 is a cross-sectional view of the IC card taken along a line G-G of FIG. 35. For facilitating the understanding, the structure inside of the IC body (such as semiconductor chip 7, bonding wire 9 and interconnect 10) is omitted in FIGS. 34 and 36.

The IC card 1b as illustrated in FIGS. 33 and 34 are manufactured as in the IC card of Embodiment 1 and has a substantially similar structure to that of the IC card 1 of Embodiment 1 except that the number and function of the external connection terminal 6 are different. In the IC card 1 of Embodiment 1, or the IC card 1b as illustrated in FIGS. 33 and 34, the sealing portion 3 is a little protruded and not planarized on the surface on the side of the external connection terminal.

In the IC card 1c of the present embodiment as illustrated in FIGS. 35 and 36, on the other hand, the surface of the IC card 1c on the side of the external connection terminal 6 is planarized. Such a structure is available by disposing a step difference on the back side surface of the IC body 4d which is to be installed in the case 2, disposing an external connection terminal 6 over the projecting portion and forming the sealing portion 3 so as to constitute the surface of the sealing portion 3 for sealing the IC body 4 on much the same level with the external connection terminal 6. Accordingly, the IC card 1c has a structure having the external connection terminal 6 disposed over a flat surface.

Figure 37:
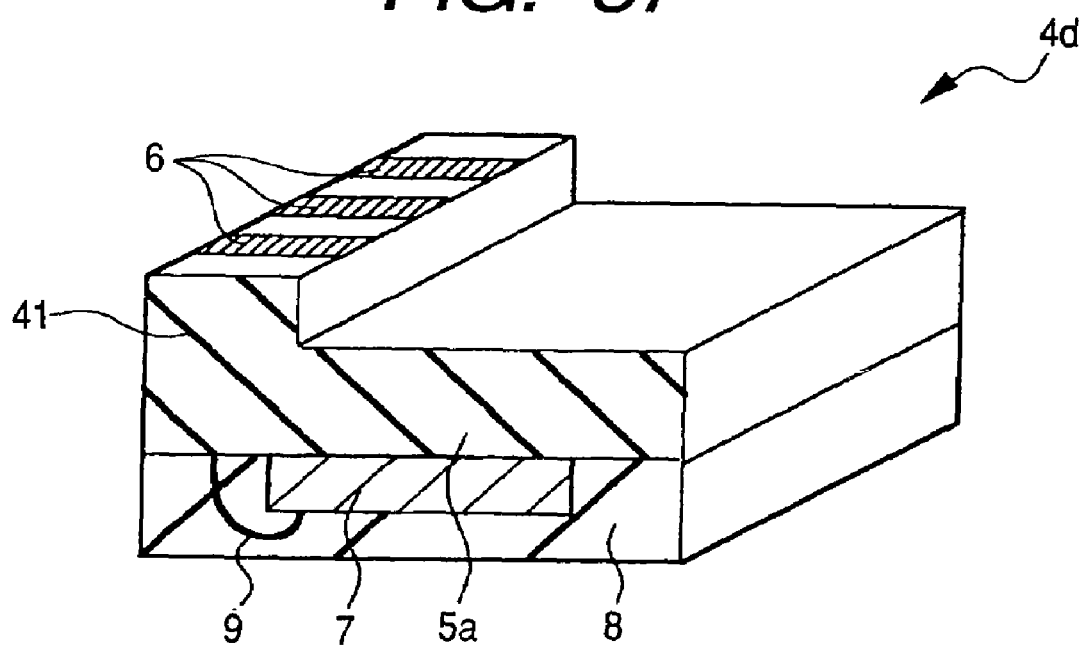
FIG. 37 is a cross-sectional perspective view illustrating the structure of an IC body used for the IC card of FIG. 35.

FIG. 37 is a cross-sectional perspective view illustrating the structure of the IC body 4d used for the IC card 1c of this embodiment. It has a structure in which a step difference is disposed on the back side surface of the IC body 4d; an external connection terminal 6 is disposed over the projecting portion 41, and a formation region of the external connection terminal 6 is protruded relative to a region, other than the formation region of the external connection terminal 6, on the back side surface of the IC body 4d.

The IC body 4d of FIG. 37 can be formed or manufactured, for example, in the following manner. First, prepared is a wiring substrate 5a having a protruded structure relative to a region other than the formation region of the external connection terminal 6 by disposing a step difference on the back side surface of the IC body and then disposing the external connection terminal 6 over the projecting portion 41. A semiconductor chip 7 is mounted over the surface of the wiring substrate 5a and the semiconductor chip 7 and wiring substrate 5a are electrically connected via a bonding wire 9. Then, the semiconductor chip 7 and bonding wire 9 are sealed with a sealing portion 8 made of a thermosetting resin material, whereby the IC body 43d of this embodiment is formed.

The IC body 4d as illustrated in FIG. 37 corresponds to a semiconductor device in the form of MAP (mold array package) or COB (clip on board). As the IC body, a semiconductor device in the form of QFN (quad flat non leaded package is also usable FIG. 38 is a cross-sectional perspective view illustrating the structure of another IC body 4e usable for the IC card 1c of this embodiment.

Figure 38:
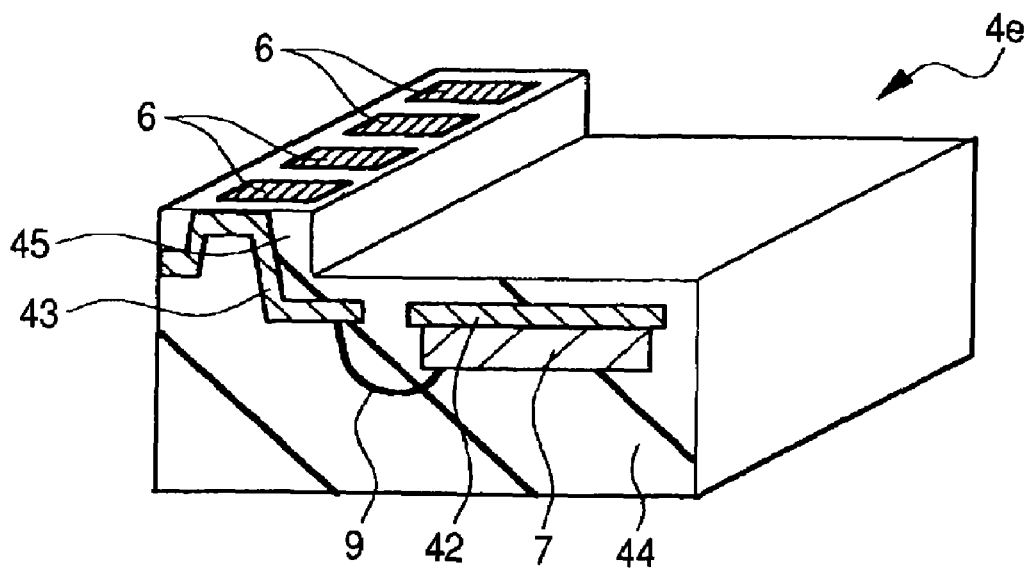
FIG. 38 is a cross-sectional perspective view illustrating the structure of another IC body used for the IC card of FIG. 35.

The IC body 4e of FIG. 38 has, similar to the IC body 4d of FIG. 37, a structure in which a step difference is disposed over the back side surface of the IC body 4e; an external connection terminal 6 is disposed over its projecting portion 45; and on the back side surface of the IC body 4e, the formation region of the external connection terminal 6 is protruded relative to a region other than the formation region of the external connection terminal 6.

The IC body 4e of FIG. 38 can be formed or manufactured, for example, in the following manner. A semiconductor chip 7 is mounted over a die pad 42 of a lead frame and an electrode pad of the semiconductor chip 7 is electrically connected to a lead portion 43 of the lead frame via a bonding wire 9. A sealing portion 44 made of a thermosetting resin material is formed to cover the semiconductor chip 7, bonding wire 9, die pad 42 and lead portion 43. The lead portion 43 is bent into a predetermined shape and the outer surface of the lead portion 43 thus bent is partially exposed from the back side surface of the sealing portion 44, whereby an external connection terminal 6 is formed. In this molding step of this sealing portion 44, by adjusting the shape of the cavity of the mold for the formation of the sealing portion 44, a step difference is disposed on the back side surface of the sealing portion 44 and the external connection terminal 6 is formed by partially exposing the outer surface of the lead portion 43 from the projecting portion 45 on the back side surface of the sealing portion 44. The lead portion 43 protruded from the sealing portion 44 is cut, whereby the IC body 4e is manufactured as illustrated in FIG. 38. Accordingly, the IC body 4e has a structure in which an outer face is constituted by the sealing portion 44 made of a thermosetting resin and the external connection terminal 6 is exposed from the projecting portion 45 on the back side surface.

Figure 39:
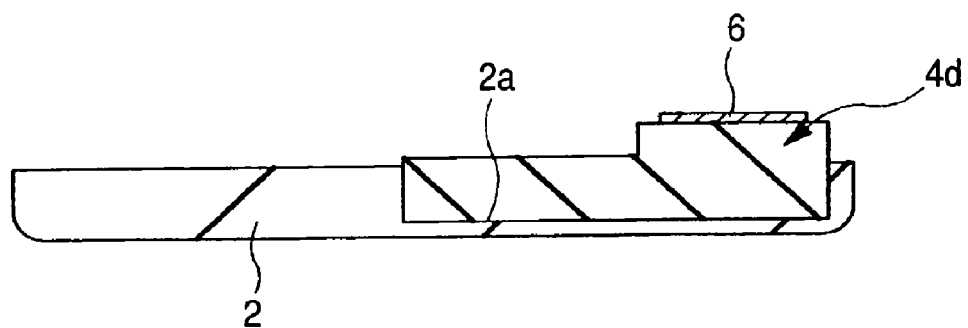
FIG. 39 is a cross-sectional view of the IC card of FIG. 35 during its manufacturing step.
Figure 40:
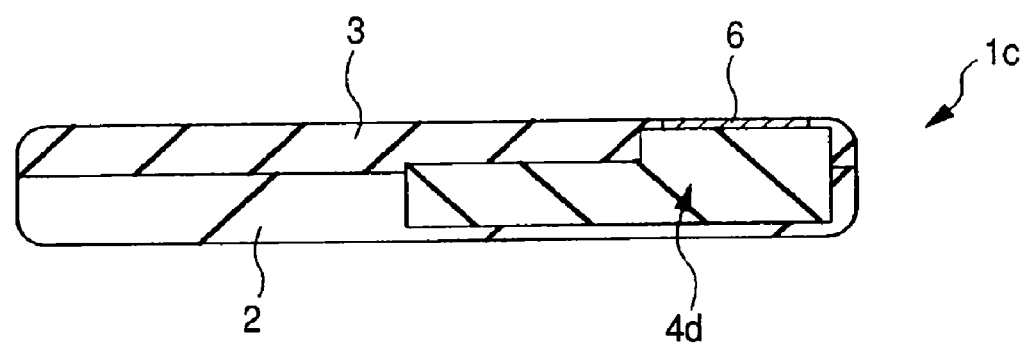
FIG. 40 is a cross-sectional view of the IC card during its manufacturing step following the step of FIG. 39.

In the next place, the manufacturing (fabrication) steps of the IC card of this embodiment will be described. FIGS. 39 and 40 are cross-sectional views of the IC card 1c according to this embodiment during its manufacturing steps. To facilitate the understanding, the structure inside of the IC body 4d (such as semiconductor chip 7, bonding wire 9 and interconnect 10) is not illustrated in FIGS. 39 and 40.

As described above, a step difference is disposed over the back side surface and the IC body 4d (or 4e) having the external connection terminal 6 disposed over its projecting portion is installed in the recess portion 2a of the case 2 made of a thermoplastic resin material, as illustrated in FIG. 39. The recess portion 2a of the case 2 has a shape permitting the IC body 4d to fit therein. In addition, a step difference on the back side surface of the wiring substrate 5, the depth of the recess portion 2a of the case 2 or the thickness of the case 2 is adjusted so that the external connection terminal 6 will protrude relative to a surface other than the recess portion 2a of the case 2 when the IC body 4b is installed in the recess portion 2a of the case 2. As illustrated in FIG. 40, the sealing portion 3 made of a thermoplastic resin material is formed to expose the external connection terminal 6 and to cover the case 2 and the back side surface of the IC body 4d except the external connection terminal 6. In this embodiment, the sealing portion 3 is molded over a region other than the formation region of the external connection terminal 6 while only the formation region of the external connection terminal 6 is protruded so that it is possible to mold the sealing portion 3 to planarize the external connection terminal 6 (the projecting portion 41 on the back side surface of the wiring substrate 5) and sealing portion 3. In this manner, the IC card 1c of this embodiment is manufactured. The surface of the IC card 1c on the side on which the external connection terminal 6 has been disposed is planarized. The IC card 1c as illustrated in FIG. 35 is different from the IC card 1 of FIG. 1 in the number or arrangement of the external connection terminals 6, but the number or arrangement of the external connection terminals 6 can be changed, depending on the design.

The surface of the IC card 1c on the side opposite to the side on which the external connection terminals 6 have been disposed can be easily planarized by planarizing the surface of the case 2 on the side opposite to the side on which the IC body 4d is installed.

In Embodiment 1, the thickness of the case 2 in a region other than the recess portion 2a substantially corresponds to the thickness of the IC card 1. In this embodiment, the total of the thickness of the case 2 in a region other than the recess portion 2a and the thickness of the sealing portion 3 formed thereover substantially correspond to the thickness of IC card 1c.

Embodiment 5

Figure 41:
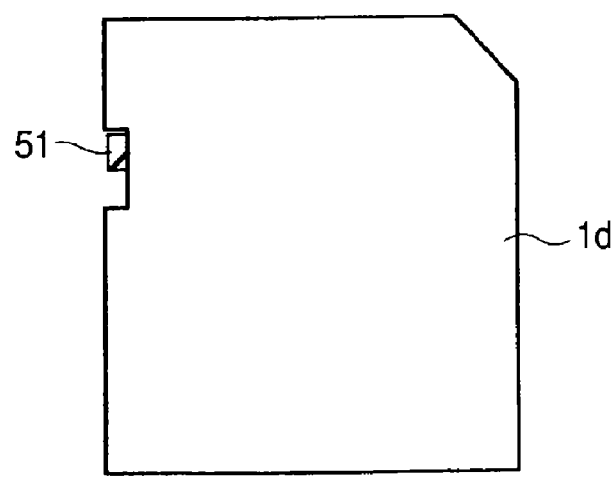
FIG. 41 is a plan view of an IC card according to a still further aspect of the present invention.

In the IC card according to Embodiment 1, a mechanically operated part such as slidable part can be disposed, for example, over the main surface or side surface of the IC card. In this Embodiment, the term "mechanical operated part" means a part bonded to the IC card (mechanically) operatively. FIG. 41 is a plan view illustrating the IC card 1d of the present embodiment having a mechanically operated part 51 disposed thereon. The mechanically operated part 51 of the IC card 1d can be moved or slid in a direction parallel to the side surface of the IC card 1d and it is used, for example, to switch between a write enabled state and a write protected state into the IC card.

When the mechanically operated part 51 is attached to the IC card prior to the formation of the sealing portion 3, in other words, when molding of the sealing portion 3 is conducted while having the mechanically operated part 51 attached to the case 2, there is a fear of the molding resin material of the sealing portion 3 adhering to the mechanically operated part 51, and integrating the mechanically operated part 51 with the sealing portion 3. Another fear is that the mechanically operated part 51 undergoes deformation by the heat of the molding resin material of the sealing portion 3 during the molding step of the sealing portion 3. Such adhesion or deformation may presumably act to disturb the smooth operation of the mechanically operated part 51, and make normal operation of the mechanically operated part 51 impossible.

In this Embodiment, after the formation of the sealing portion 3, the mechanically operated part 51 is attached to the IC card 1d. The formation step (molding step of the sealing portion 3 therefore does not adversely affect the mechanically operated part 51.

Figure 42:
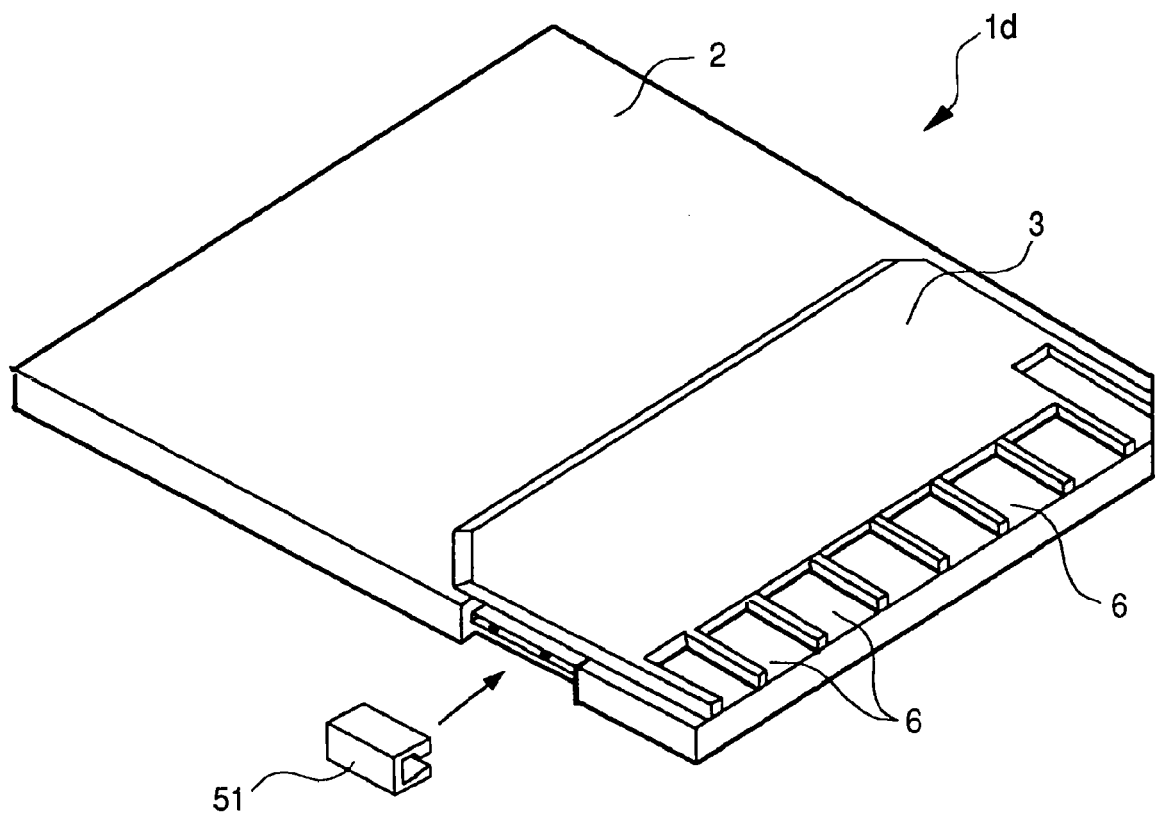
FIG. 42 is a perspective view for explaining a fitting manner of a mechanically operated part in the IC card.
Figure 43:
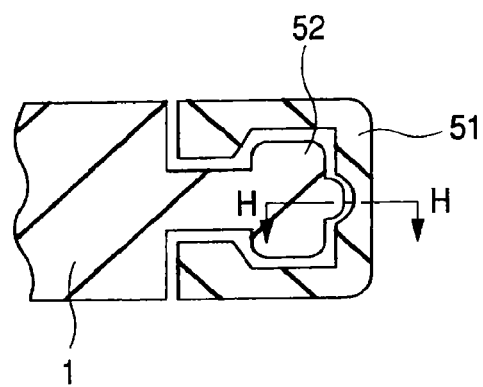
FIG. 43 is a fragmentary cross-sectional view illustrating the mechanically operated part fitted in a fitting portion of the IC card.
Figure 44:
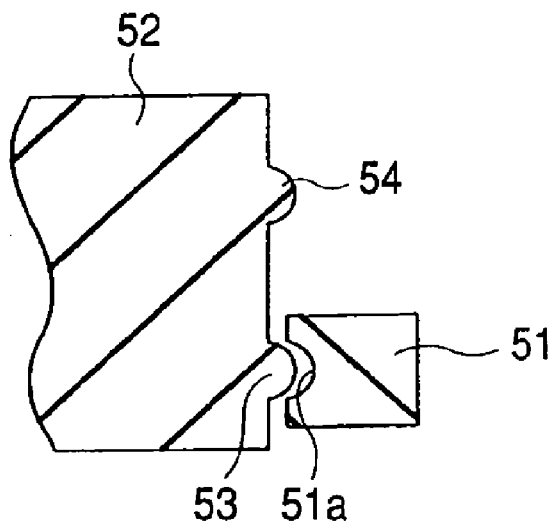
FIG. 44 is a fragmentary cross-sectional view taken along a line H-H of FIG. 43.

FIG. 42 is a perspective view for explaining the fitting manner of the mechanically operated part 51 in the IC card 1d. FIGS. 43 and 44 are fragmentary cross-sectional views illustrating the mechanically operated part 51 fitted in a fitting portion 52 of the IC card 1d. FIG. 43 corresponds to the cross-section vertical to the side surface on which the mechanically operated part 51 of the IC card 1d has been attached and the main surface of the IC card 1d, while FIG. 44 corresponds to the cross-section taken along a line H-H of FIG. 43.

As illustrated in FIGS. 42 to 44, upon attaching the mechanically operated part 51 to the IC card 1d, the mechanically operated part 51 is fitted in the fitting portion 52 (protrusion, trench, projection, or recess, or their combination) which is a projection-recess portion for the attachment of the mechanically operated part 51 of the IC card 1d. The fitting portion may be formed in advance in the case 2 or may be formed from a molding resin material of the sealing portion 3 in the molding step of the sealing portion 3, without forming in the case 2. It is however preferred to form the sealing portion 3 integral with the fitting portion 52 by using a molding resin material in the molding step of the sealing portion 3, because deformation of the fitting portion 52 which will otherwise occur by the heat upon molding of the sealing portion 3 can be prevented without failure. The structure and manufacturing steps of the IC card 1d are similar to those of the IC card 1 of Embodiment 1 except for the disposal of the fitting portion 52, so that a detailed description is omitted here.

In this Embodiment, after molding of the sealing portion 3, the mechanically operated part 51 is fitted in the fitting portion 52 and it is bonded or attached movably to the IC card 1d. The mechanically operated part 51 and the fitting portion 52 can take any form. For example, the projecting portion of the fitting portion 52 can be fitted in the recess portion of the mechanically operated part 51, or the projecting portion of the mechanically operated part 51 can be fitted in the recess portion of the fitting portion 52.

In the structure as illustrated in FIGS. 42 to 44, the mechanically operated part 51 fitted in the fitting portion 52 is formed movably in a direction along the side surface of the IC card 1d (direction vertical to the paper in FIG. 43, up/down direction parallel to the paper in FIG. 44). In the structure as illustrated in FIGS. 42 to 44, a protruded fitting portion 52 having a relatively large end portion is inserted in the mechanically operated part 51 and the mechanically operated part 51 having the fitting portion 52 inserted therein is movable (slidable) in a direction along the side surface of the IC card 1d.

The mechanically operated part 51 and the fitting portion 52 have a structure for positioning the mechanically operated part 51, for example, at the write enabled position and write protected position to the IC card. For example, when a dent portion 51a of the mechanically operated part 51 is engaged with a protrusion 53 or 54 at the end of the fitting portion 52, the position of the mechanically operated part 51 becomes stable, or is fixed. By setting the position at which the dent portion 51a of the mechanically operated part 51 is engaged with the protrusion 53 of the fitting portion 52 as a write enabled position to the IC card and the position at which it is engaged with the protrusion 54 as a write protected position to the IC card, movement of the mechanically operated part 51 between the write enabled position and the write protected position and fixation of it at each position can be carried out smoothly.

Figure 45:
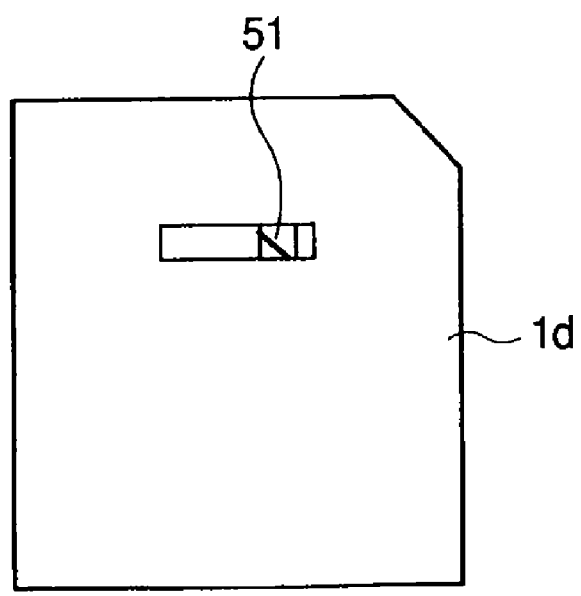
FIG. 45 is a plan view of an IC card according to a still further aspect of the present invention.

The mechanically operated part 51 can be disposed not only on the side surface of the IC card but at any position and the number of it is not limited (singular or plural). The mechanically operated part 51 can be moved in any direction. For example, as illustrated in the plan view of FIG. 45, over the main surface of the IC card 1d, the mechanically operated part 51 is disposed movably in a direction parallel to the main surface of the IC card 1d. Alternatively, a fitting portion 52 is disposed in the IC body 4 and the mechanically operated part 51 can be installed to the fitting portion 52 disposed in the IC body 4. In this case, in the molding step of the sealing portion 3, a care must be taken so as not to inject the molding resin material in the fitting portion 52 disposed in the IC body 4 and in the vicinity thereof. In order to attain this, it is recommended to adjust the shape of the cavity of the mold, thereby preventing the sealing portion 3 from being formed over the fitting portion 52 disposed in the IC body 4 and the external connection terminal 6.

Embodiment 6

Figure 46:
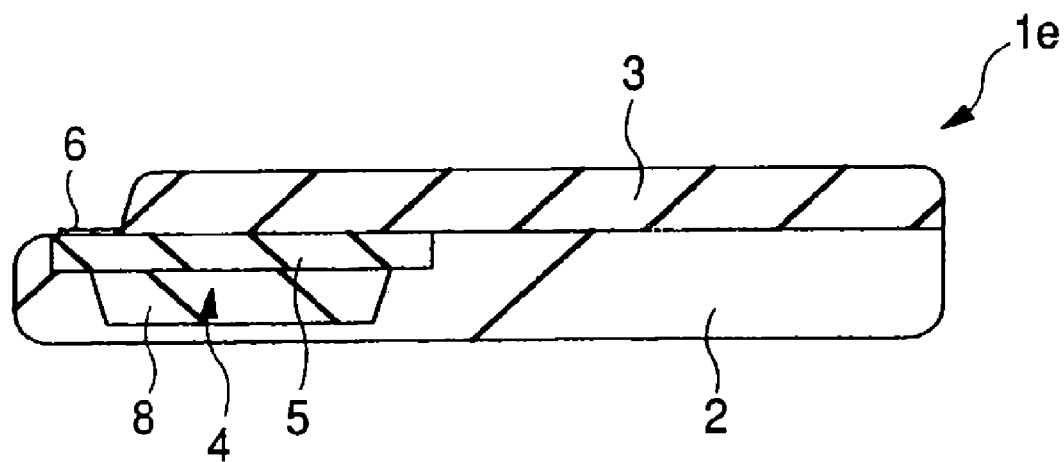
FIG. 46 is a cross-sectional view of an IC card according to a still further aspect of the present invention.
Figure 47:
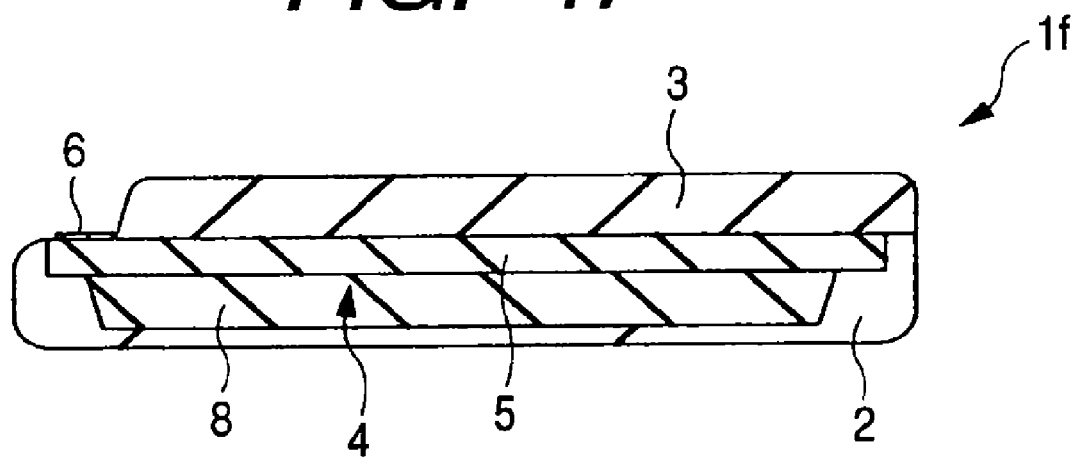
FIG. 47 is a cross-sectional view of an IC card according to a still further aspect of the present invention.

FIGS. 46 and 47 are cross-sectional views of the IC cards 1e and 1f, respectively, according to a still further embodiment of the present invention. For facilitating the understanding, the inside structure (such as semiconductor chip 7, bonding wire 9 and interconnect 10) of the IC body 4 are omitted from FIGS. 46 and 47.

In Embodiment 1, in the case 2, the IC body 4 which has a relatively small planar area (size) compared with the case is installed and the sealing portion 3 is formed so as to cover a region of the IC body 4 fitted in the case 2 except the external connection terminal 6, as illustrated in FIG. 2. The sealing portion 3 is formed over a predetermined region over one of the surfaces of the case 2 (main surface on the side on which the IC body 4 has been mounted), for example, about half of the case 2, to cover a region of the IC body 4 except the external connection terminal 6.

It is however only necessary to form the case 2 integral with the IC body 4 while sealing the IC body 4 to expose the external connection terminal 6 and a ratio of the sealing portion 3 to the main surface of the case 2 is not limited. A ratio of the size of the IC body 4 to the size of the case 2 (IC card) is also not limited.

For example, the sealing portion 3 can be formed almost all over the one of the surfaces of the case 2 (main surface on the side on which the IC body 4 is mounted) so as to cover a region of the IC body 4 except the external connection terminal 6, as in the IC card 1e illustrated in FIG. 46.

Alternatively, the IC card 1f can be formed by fitting the IC body 4 having a size close to that of the case 2 (IC card) in the dent or recess portion of the case 2 and then molding the sealing portion 3, as in the IC card 1f illustrated in FIG. 47.

Embodiment 7

FIGS. 48 to 51 are plan views for explaining the manufacturing steps of the IC card according to a still further embodiment of the present invention.

Figure 48:
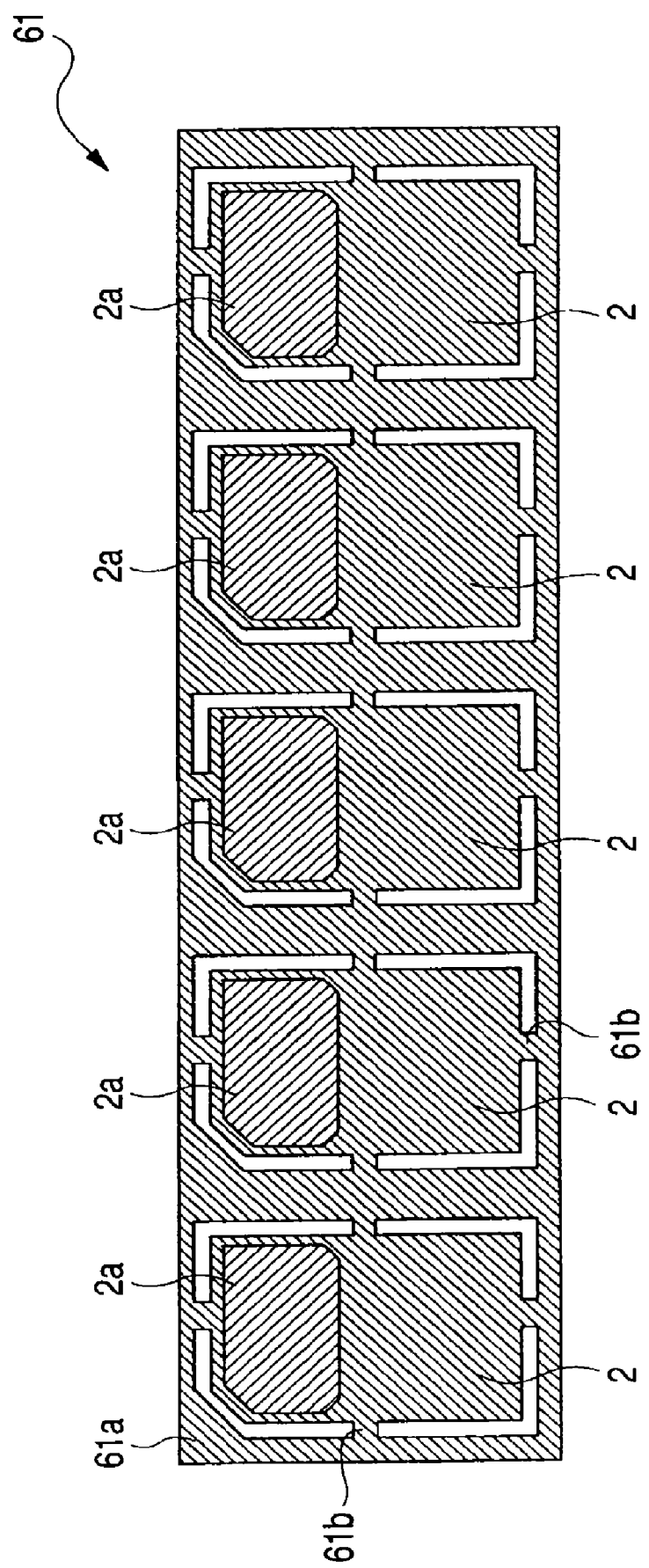
FIG. 48 is a plan view of an IC card according to a still further embodiment of the present invention during its manufacturing step.

As illustrated in FIG. 48, a frame 61 having an array of plural cases 2 is formed using a thermoplastic resin, for example, by injection molding. The frame 61 has a structure in which plural cases 2, five cases in the above diagram, have been connected to a frame body 61a via a fine joint 61b.

Figure 49:
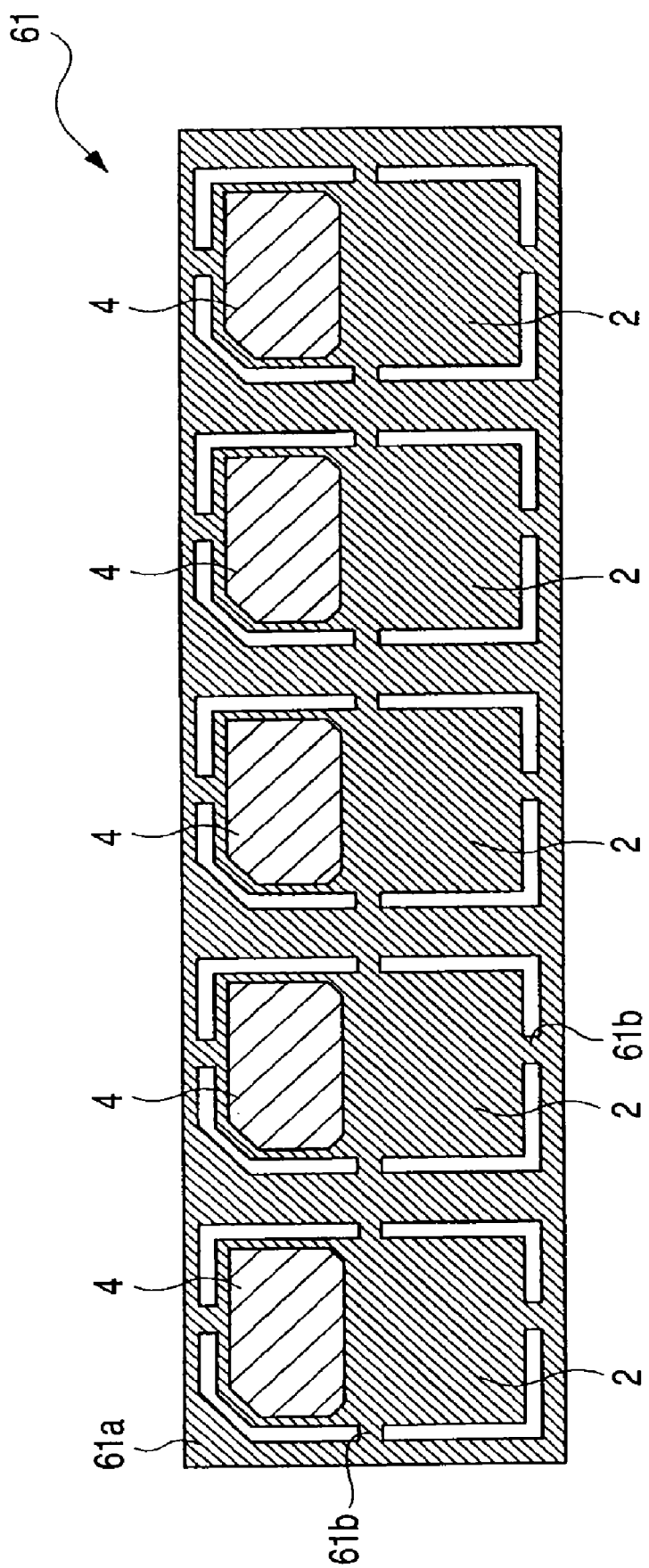
FIG. 49 is a plan view of the IC card during its manufacturing step following the step of FIG. 48.

As illustrated in FIG. 49, an IC body 4 is then loaded (fitted) in a recess portion 2a of each of the cases 2 constituting the frame 61.

Figure 50:
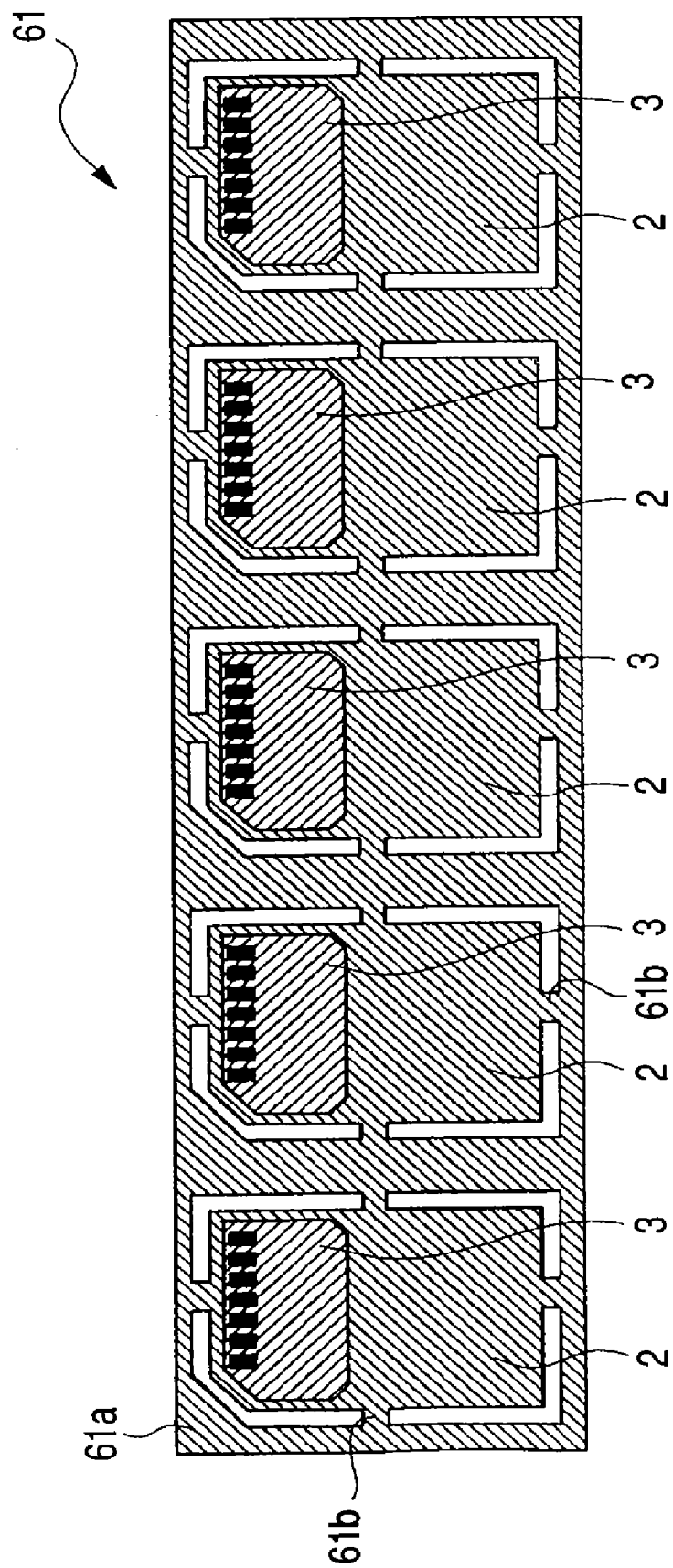
FIG. 50 is a plan view of the IC card during its manufacturing step following the step of FIG. 49.

As illustrated in FIG. 50, sealing portions 3 for sealing the IC body 4 are molded in block by transfer molding so as to cover a region of the IC body 4 except the external connection terminals 6, whereby the IC body 4 is bonded to or integrally formed with each of the cases 2 of the frame 61 via the sealing portion 3. In the molding step of the sealing portion 3, it is preferred to mold in block the sealing portions 3 of all the cases 2 constituting the frame 61, because it enables production of a large number of IC cards on an assembly line. As another method for molding the sealing portion 3, the sealing portions 3 can be formed respectively for the cases 2 constituting the frame 61.

As illustrated in FIG. 51, the frame 61 is cut at the peripheral portion of each case 2, that is, the joint 61b to separate into pieces, that is, IC cards 1, whereby plural IC cards 1, five IC cards 1 in this embodiment, can be manufactured from one frame 61.

The manufacturing method according to this embodiment enables production of a plurality of IC cards 1 at once and production of a large number of IC cards 1 in a short time. It can reduce the manufacturing time and manufacturing cost of the IC card. Accordingly, the manufacturing steps of this embodiment are suited for mass production of the IC card 1.

In this Embodiment, the frame 61 having an array of five cases 2 is used, however, the number of the cases 2 constituting the frame 61 is not limited to five. It is possible to manufacture IC cards by using the frame 61 having an array of any number (plural) of cases 2.

The invention made by the present inventors was described specifically based on embodiments thereof. It should however be born in mind that the present invention is not limited to them but can be modified within an extent not departing from the gist of the invention.

The present invention can be applied not only to memory cards having therein a flash memory (EEPROM) such as MMC (multimedia card) and SD card, but also memory cards having therein a memory circuit such as SRAM (static random access memory), FRAM (ferroelectric random access memory) and MRAM (magnetic random access memory) and IC (integrated circuit) cards without a memory circuit.

Advantages available by the typical inventions, among the inventions disclosed by the present application, will next be described simply.

By installing a semiconductor device which has a semiconductor chip sealed at least partially with a first sealing portion made of a thermosetting resin material in a case made of a thermoplastic resin material and sealing the resulting case with a second sealing portion made of a thermoplastic resin material, it is possible to improve the reliability of the IC card. In addition, the manufacturing cost of the IC card can be reduced.

What is claimed is:
1. A memory card comprising:
a substrate having a front surface and a rear surface,
a flash memory chip mounted over the front surface of the substrate,
a controller chip for the flash memory chip mounted over the front surface of the substrate,
a plurality of external connection terminals arranged over the rear surface of the substrate,
a first sealing portion covering the flash memory chip, the controller chip and the front surface of the substrate, and
a case covering the first sealing portion, wherein a second sealing portion is formed over the rear surface of the substrate and covers the rear surface of the substrate such that the external connection terminals are exposed, wherein the first sealing portion is made of thermosetting resin material, wherein the case and the second sealing portion are made of thermoplastic resin material, wherein an area size of the second sealing portion is larger than that of the substrate, and wherein the second sealing portion adheres to the case.

2. A memory card according to claim 1, wherein a size of adhered area between the second sealing portion and the case is larger than that of overlapped area between the substrate and the second sealing portion.

3. A memory card according to claim 2, wherein a content of glass filler contained in the first sealing portion is less than a content of glass filler in the second sealing portion or the case.

4. A memory card according to claim 2, wherein the first sealing portion is formed of epoxy resin, and wherein the case and the second sealing portion are formed of polycarbonate, ABS (acrylonitrile butadiene styrene resin), PBT (polybutylene terephthalate), PPE (polyphenylene ether), nylon, LCP (liquid crystal polymer), PET (polyethylene terephthalate), or mixtures thereof.

5. A memory card according to claim 2, wherein a rear portion of the case has a recess portion, and wherein the first sealing portion is fixed in the recess portion.

6. A memory card according to claim 5, wherein no adhesive exists between the first sealing portion and the recess portion.

7. A memory card comprising:

a substrate having a front surface and a rear surface, a flash memory chip mounted over the front surface of the substrate, a controller chip for the flash memory chip mounted over the front surface of the substrate, a plurality of external connection terminals arranged over the rear surface of the substrate, a first sealing portion covering the flash memory chip, the controller chip and the front surface of the substrate, and a case covering the first sealing portion, wherein a second sealing portion is formed over the rear surface of the substrate and covers the rear surface of the substrate such that the external connection terminals are exposed, wherein the first sealing portion is made of thermosetting resin material, wherein the case and the second sealing portion are made of thermoplastic resin material, wherein the second sealing portion adheres to the case, and wherein a size of adhered area between the second sealing portion and the case is smaller than that of overlapped area between the substrate and the second sealing portion.

8. A memory card according to claim 7, wherein the adhered area is located on a peripheral area of memory card.

9. A memory card according to claim 8, wherein a content of glass filler contained in the first sealing portion is less than a content of the glass filler in the second sealing portion or the case.

10. A memory card according to claim 8, wherein the first sealing portion is formed of epoxy resin, and wherein the case and the second sealing portion are formed of polycarbonate, ABS (acrylonitrile butadiene styrene resin), PBT (polybutylene terephthalate), PPE (polyphenylene ether), nylon, LCP (liquid crystal polymer), PET (polyethylene terephthalate), or mixtures thereof.

11. A memory card according to claim 8, wherein a rear portion of the case has a recess portion, and wherein the first sealing portion is fixed in the recess portion.

12. A memory card according to claim 11, wherein no adhesive exists between the first sealing portion and the recess portion.

* * * * *